(12) United States Patent
Lynn

(10) Patent No.: US 12,261,428 B2
(45) Date of Patent: Mar. 25, 2025

(54) PROTECTIVE MESH ARRAY FOR USE WITHIN AN ELECTRICAL NETWORK

(71) Applicant: David Lynn, Welcome, NC (US)

(72) Inventor: David Lynn, Welcome, NC (US)

(*) Notice: Subject to any disclaimer, the term of this patent is extended or adjusted under 35 U.S.C. 154(b) by 360 days.

(21) Appl. No.: 17/803,597

(22) PCT Filed: Mar. 5, 2020

(86) PCT No.: PCT/US2020/021080
§ 371 (c)(1),
(2) Date: Sep. 6, 2022

(87) PCT Pub. No.: WO2021/177958
PCT Pub. Date: Sep. 10, 2021

(65) Prior Publication Data
US 2023/0318285 A1    Oct. 5, 2023

(51) Int. Cl.
*H02H 7/28* (2006.01)
*H05K 7/02* (2006.01)

(52) U.S. Cl.
CPC .............. *H02H 7/28* (2013.01); *H05K 7/02* (2013.01)

(58) Field of Classification Search
CPC ......... Y02E 10/50; Y02E 10/44; Y02E 10/47; Y02E 10/40; Y02E 10/548; Y02B 10/10; Y02B 10/20; H01R 11/30; H01R 12/721; H01R 13/187; H01R 13/6641; H01R 2101/00; H01R 24/28; H01R 35/04
See application file for complete search history.

(56) References Cited

U.S. PATENT DOCUMENTS

2018/0351502 A1* 12/2018 Almy .................. H02S 20/25

* cited by examiner

*Primary Examiner* — Bryan R Perez

(57) ABSTRACT

A protective mesh system for distributing electrical power. The protective mesh system may include a body that supports and positions a protective mesh within its outer edges. The protective mesh may be of a single polarity and includes conductors and circuit opening devices. The protective mesh may provide for connecting to one or more power devices. One or more connectors may be electrically connected to the protective mesh and positioned along one or more of the edges of the body. The connectors may provide for connecting to an external power source.

28 Claims, 22 Drawing Sheets

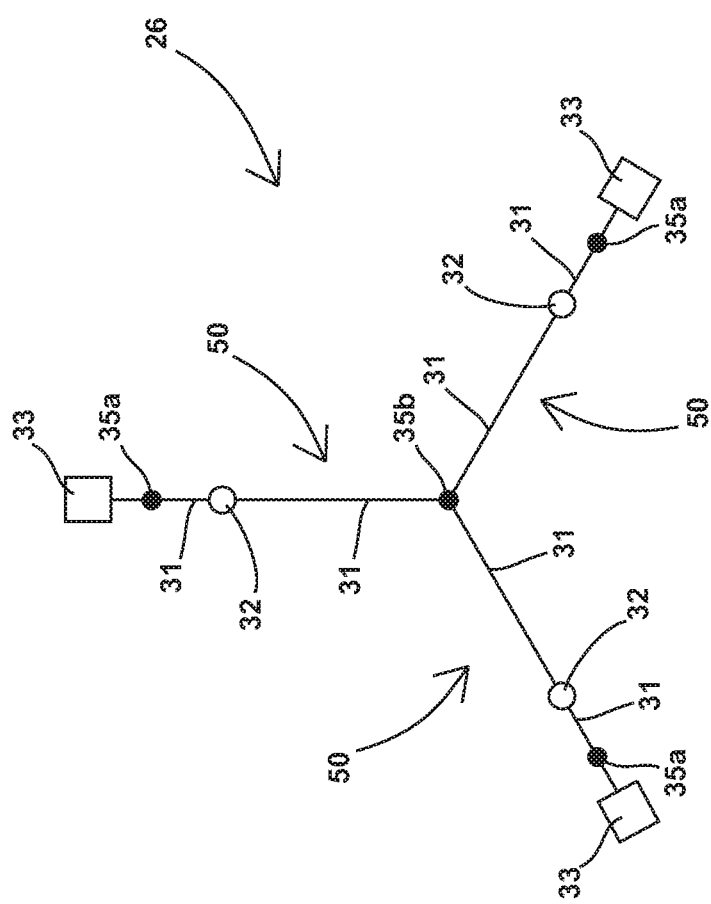

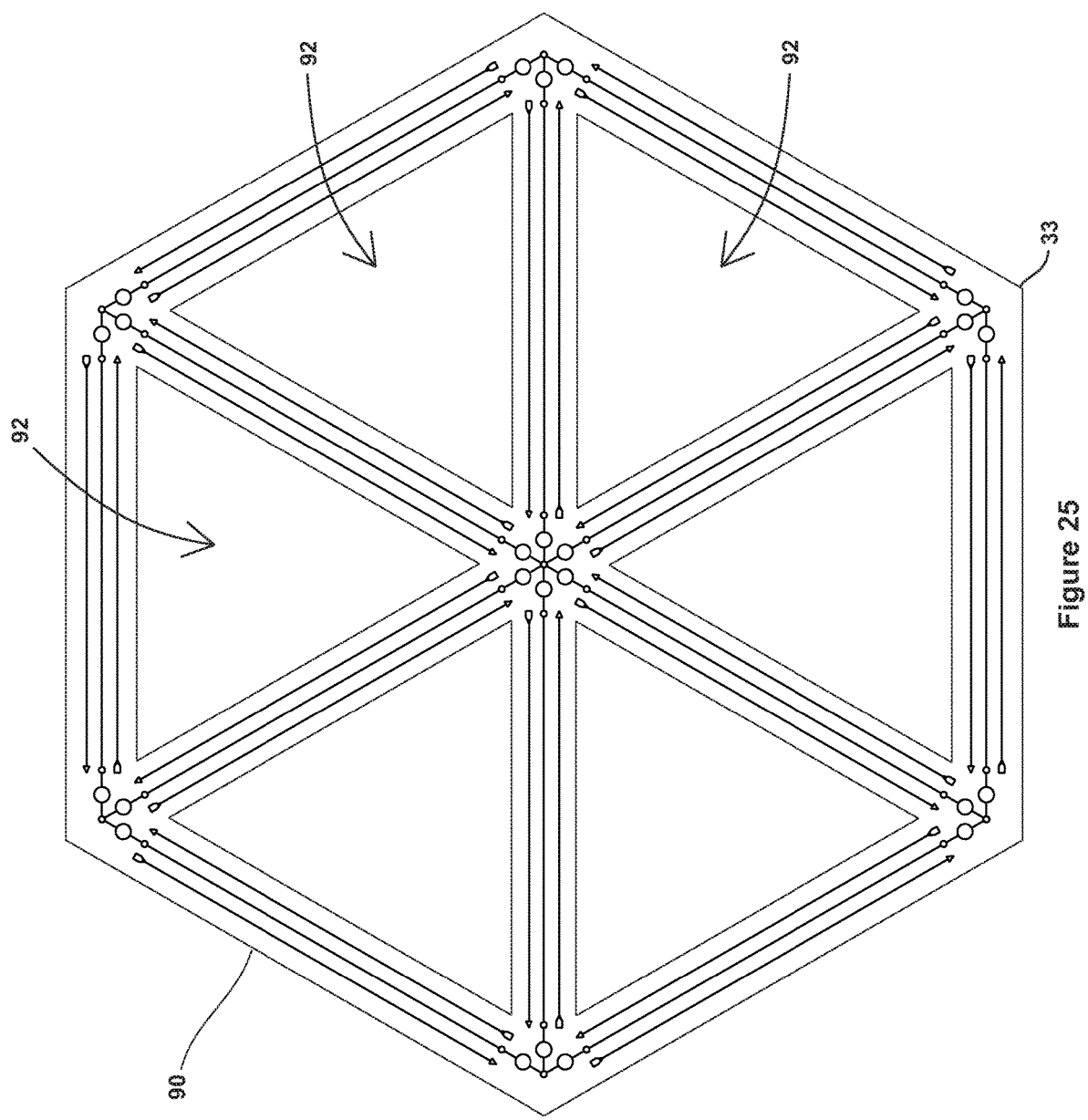

PROTECTIVE MESH ARRAY FOR USE WITHIN AN ELECTRICAL NETWORK

BACKGROUND

Since the days of Nikola Tesla and Thomas Edison, virtually all buildings use electrical power that is generated offsite. Electrical supply lines arrive at the building site overhead or underground, connect to an electric meter, then thru a wall to connect to a distribution panel.

The building includes a branch circuit system to distribute the electrical power throughout the building. Branch circuit systems include branching circuits of electrically parallel conductive elements that lead from the distribution panel. These branching circuits are protected by circuit opening devices (e.g., circuit breakers, fuses) located at the distribution panel and may also be augmented along the path of the conductive elements or at the load being serviced.

The branch circuit systems are inherently inefficient at serving the widely distributed loads that are common in buildings. The branch circuit systems require large conductive elements and large breakers at the distribution panel to protect the smaller parallel conductive elements and smaller circuit breakers. A typical branch circuit system in a moderate-sized building may require between 3-10 different sizes and/or types of wire. There may be just as many or more types of circuit opening devices. Branch circuit systems generally comprise three types of circuits: 1—the mains circuit of supply coming from offsite; 2—dedicated circuits normally supplying electricity directly to a single, usually large load, such as HVAC, water heater, oven, clothes dryer, etc.; and 3—general circuits used to power lighting and convenience outlets.

Branch circuit systems are complex which causes a variety of issues. The branch circuit systems are designed to meet electrical codes to safely accommodate a myriad of possible circuits and the variety of loads from the potential dangers of fire and electrical shock. The codes have specific instructions for hundreds or thousands of different configurations spelled out in great detail and endlessly cross-referenced. Entities working with branch circuit systems, such as manufacturers, designers, engineers, installers, and technicians require professional training and ongoing education to understand these ever changing and increasingly complex electrical codes.

SUMMARY

Peer to peer power distribution networks have many advantages over branch circuit systems. Peer to peer networks can be manufactured into general construction panels used for floors, walls, ceilings, and roofs. Peer to peer networks can be profoundly simpler than branch circuit systems and provide for sharing electrical power between decentralized loads, sources, and storage devices. Peer to peer networks can be designed for connected devices and conductive elements to be protected at nodes utilizing standardized conductive elements and circuit opening devices.

One aspect is directed to a protective mesh array for supplying electrical power to one or more power devices. The protective mesh array comprises a plurality of panels each comprising a top side, a bottom side, and outer edges, and a mesh section attached to and supported by the panel, the mesh section forming two or more electrical paths that are each electrically protected to prevent an excess current from reaching the one or more power devices. The plurality of panels are mechanically connected together in a side-by-side arrangement with the outer edges positioned together and the mesh sections electrically connected together to form a single protective mesh that extends across the plurality of panels.

In another aspect, the protective mesh array comprises a frame with a plurality of support members that are spaced apart to form openings each sized to receive one of the panels.

In another aspect, the mesh section comprises two or more electrical connectors to connect to one of another one of the panels or to an external electrical system; a plurality of links electrically interconnected and electrically connected to the two or more electrical connectors with each of the links comprising at least one conductive element and at least one circuit opening device; and a plurality of nodes that connect together three or more of the links with each of the nodes positioned with at least one of the circuit opening devices electrically positioned between the node and each of the electrical connectors.

In another aspect, each of the links comprises a common number and arrangement of the conductive elements and the circuit opening devices.

In another aspect, the electrical connectors are positioned on the outer edges of the body.

In another aspect, the protective mesh array comprises a spur line that extends from the conductive element of one of the links with the spur line electrically connected to one of the power devices.

In another aspect, the protective mesh array comprises one or more mechanical connectors on each of the panels to mechanically connect the panels together in the side-by-side arrangement with the top surfaces of the panels aligned together.

In another aspect, the protective mesh array comprises one or more mechanical connectors on each of the panels to mechanically connect the panels to the frame with the top surfaces of the panels aligned together.

In another aspect, the mesh section is embedded within an interior of the panel in one or more of the panels.

One aspect is directed to a protective mesh array for supplying electrical power to one or more power devices. The protective mesh array comprises a frame, a plurality of panels that each include outer edges with one or more panel mechanical connectors to mechanically connect to the frame and one or more panel electrical connectors to electrically connect to the frame; and a protective mesh that spans across the plurality of panels and is formed by individual mesh sections in the panels that are electrically joined through the electrical connectors.

In another aspect, the protective mesh comprises: mesh electrical connectors positioned at a perimeter of the planar member and configured to electrically connect to an external electrical system; a plurality of conductive elements and circuit opening devices that are electrically interconnected and electrically connected to the electrical connectors; and the conductive elements and circuit opening devices connected together at a plurality of nodes with each of the nodes positioned with at least one of the circuit opening devices electrically positioned between the node and each of the electrical connectors to protect the power devices that are connected to the nodes from electrical current above a predetermined level.

In another aspect, the electrical connectors are positioned at the outer edges of the panels.

In another aspect, the conductive elements and circuit opening devices form a plurality of links within the protective mesh with each of the links comprises one of the conductive elements and at least one of the circuit opening devices.

In another aspect, each of the links comprises a common number and arrangement of the conductive elements and the circuit opening devices with the protective mesh comprising a uniform arrangement.

In another aspect, the protective mesh further comprises a spur line that extends from one of the conductive elements with the spur line electrically connected to one of the power devices.

In another aspect, one or more of the panels comprise photovoltaic cells that are electrically connected to the mesh section of the panel.

One aspect is directed to a protective mesh array for supplying electrical power to one or more power devices. The protective mesh array comprises a planar member comprising outer edges. A protective mesh is attached to and supported by the planar member with the protective mesh configured to be electrically connected to the one or more power devices and comprising a plurality of links each comprising at least one conductive element and at least one circuit opening device, and with the links connected together at a plurality of nodes. Each of the nodes is configured to connect to one of the power devices. The nodes are positioned within the protective mesh with at least one of the circuit opening devices electrically positioned between the node and the outer edges of the panel to protect the power devices that are connected to the nodes from electrical current above a predetermined level.

In another aspect, the planar member is divided into a plurality of panels that are electrically and mechanically connected together in a side-by-side arrangement with each of the panels comprising a mesh section with the protective mesh formed by the mesh sections of the plurality of panels.

In another aspect, the protective mesh array further comprises two or more electrical connectors positioned on the outer edges of the planar member through which power is supplied to the protective mesh.

In another aspect, the nodes are positioned inward away from the outer edges of the planar member.

In another aspect, one or more of the panels comprises the mesh section embedded within the panel.

One aspect is directed to a protective mesh system for supplying electrical power to one or more power devices. The protective mesh system comprises: a body comprising a top side, a bottom side, and outer edges; and a protective mesh attached to and supported by the body with the protective mesh configured to be electrically connected to the one or more power devices. The protective mesh comprises: two or more electrical connectors to supply power from an outside source to the protective mesh; a plurality of links electrically interconnected and electrically connected to the two or more electrical connectors with each of the links comprising at least one conductive element and at least one circuit opening device; and a plurality of nodes that connect together three or more of the links with each of the nodes positioned with at least one of the circuit opening devices electrically positioned between the node and each of the electrical connectors.

In another aspect, each of the links comprises a common number and arrangement of the conductive elements and the circuit opening devices.

In another aspect, the electrical connectors are positioned on the outer edges of the body.

In another aspect, the conductive element of three or more of the links comprise a main section that divides into a pair of outer conductive elements with the three or more links connected together at one of the nodes to form a ring.

In another aspect, a spur line extends from the conductive element of one of the links with the spur line electrically connected to one of the power devices.

In another aspect, the body is a panel with the top side and the bottom side being substantially flat.

In another aspect, mechanical connectors are positioned along the outer edges of the body with the mechanical connectors extending outward beyond the outer edges and configured to mechanically connect the body to a support member.

In another aspect, the electrical connectors are positioned on the outer edges of the body and are configured to supply the electrical power to the protective mesh.

One aspect is directed to a protective mesh system for supplying electrical power to one or more power devices. The protective mesh system comprises: a panel body with outer edges and a protective mesh attached to the body. The protective mesh comprises: electrical connectors that provide power from an outside source; and a plurality of conductive elements and circuit opening devices that are electrically interconnected and electrically connected to the electrical connectors. The conductive elements and circuit opening devices are connected together at a plurality of nodes with each of the nodes positioned with at least one of the circuit opening devices electrically positioned between the node and each of the electrical connectors to protect the power devices that are connected to the nodes from electrical current above a predetermined level.

In another aspect, the electrical connectors are positioned on the outer edges of the body.

In another aspect, the conductive elements and circuit opening devices form a plurality of links within the protective mesh with each of the links comprises one of the conductive elements and at least one of the circuit opening devices.

In another aspect, each of the links comprises a common number and arrangement of the conductive elements and the circuit opening devices with the protective mesh comprising a uniform arrangement.

In another aspect, the protective mesh further comprises a spur line that extends from one of the conductive elements with the spur line electrically connected to one of the power devices.

In another aspect, the body is a solar panel with photovoltaic cells.

In another aspect, the body is a wall segment and constructed from a metal.

In another aspect, mechanical connectors are positioned along the outer edges of the body with the mechanical connectors extending outward beyond the outer edges and configured to mechanically connect the body to a support member.

One aspect is directed to a protective mesh system for supplying electrical power to one or more power devices. The protective mesh system comprises: a panel with outer edges; a protective mesh attached to and supported by the panel with the protective mesh configured to be electrically connected to the one or more power devices and comprising a plurality of links each comprising at least one conductive element and at least one circuit opening device, and with the links connected together at a plurality of nodes. Each of the nodes is configured to connect to one of the power devices. The nodes are positioned within the protective mesh with at least one of the circuit opening devices electrically positioned between the node and the outer edges of the panel to protect the power devices that are connected to the nodes from electrical current above a predetermined level.

In another aspect, two or more electrical connectors are positioned on the outer edges of the body to supply power to the protective mesh.

In another aspect, the nodes are positioned inward away from the outer edges of the body.

In another aspect, the protective mesh is embedded within the body.

One aspect is directed to a power supplying device that comprises different conductive links. The different conductive links comprise: a first link comprising a first conductive element with circuit opening devices on opposing sides; and a second link comprising a second conductive element with at least one circuit opening device. The first and second links electrically are connected together at at least two nodes that connect the plurality of links in a lattice circuit. The lattice circuit comprises different interfaces that comprise: a first interface to a power source with the first interface configured to receive power from the power source; a second interface to a first electrical device with the second interface configured to provide power to the first electrical device from the power source; and a third interface to a second electrical device with the third interface configured to provide power to the second electrical device from the power source. Each of the different interfaces is positioned between at least two circuit opening devices in the lattice circuit.

In another aspect, at least one of the interfaces is positioned along each of the first and second conductive elements.

In another aspect, a third link comprising a third conductive element with at least one circuit opening device is connected to each of the first and second links at one of the nodes that forms a network node that is protected by at least two of the circuit opening devices.

In another aspect, each of the links comprises an outer conductive element positioned between the network node and one of the circuit opening devices with the outer conductive element of each of the links positioned away from the first conductive element, the second conductive element, and the third conductive element.

In another aspect, the conductive element of each of the links comprises a main section and a pair of outer conductive elements that are connected to an end of the main section and with one or more of the circuit opening devices positioned along the outer conductive elements.

In another aspect, a return path connects to each of the power source and the first and second electrical devices with the return path spaced away from the first and second links.

In another aspect, a pair of light paths extend along each of the first and second links with each of the light paths transmitting light in a single direction with a first one of the pair of light paths configured to transmit light in a first direction and a second one of the pair of light paths configured to transmit light in an opposing second direction.

One aspect is directed to a power supplying device that comprises different conductive links. The different conductive links comprise a first link comprising a first conductive element with circuit opening devices on opposing sides and a second link comprising a second conductive element with at least one circuit opening device. The first and second links are electrically connected together in a lattice circuit, wherein the lattice circuit comprises different interfaces. The different interfaces comprise a first interface to a first power device, a second interface to a second power device, and a third interface to a third power device. Each of the different interfaces is positioned between at least two circuit opening devices in the lattice circuit. The first power device is configured to provide power to the second and third power devices.

One aspect is directed to a power system comprising a first lattice section with different conductive links. The different conductive links comprise a first link with a first conductive element with circuit opening devices on opposing sides, and a second link with a second conductive element with at least one circuit opening device. The first and second links are electrically connected together at a first connection point that is in between the circuit opening devices of the first link and at a terminal end of the second link. The first and second links form a lattice circuit with all or a portion of a second lattice section. The second lattice section comprises a third link comprising a third conductive element with circuit opening devices on opposing sides, and a fourth link comprising a fourth conductive element with at least one circuit opening device. The lattice circuit comprises different interfaces that comprise: a first interface to a power source with the first interface configured to receive power from the power source; a second interface to a first electrical device with the second interface configured to provide power to the first electrical device from the power source; and a third interface to a second electrical device with the third interface configured to provide power to the second electrical device from the power source. Each of the different interfaces is positioned between at least two circuit opening devices in the lattice circuit.

In another aspect, the first and second lattice sections comprise different link patterns.

In another aspect, the second link connects to a central point of the first link.

In another aspect, a fifth link is connected to the first link at the first connection point with the second and fifth links extending outward from the first link in opposing directions.

In another aspect, the fourth link is connected to the first link at a second connection point that is positioned away from the first connection point.

In another aspect, one of the circuit opening devices on the first link is positioned between the first and second connection points.

In another aspect, each of the interfaces is positioned along the conductive element of a different one of the links.

In another aspect, each of the first, second, third, and fourth links is connected to at least one additional link with each of the additional links comprising a conductive element and at least one circuit opening device.

In another aspect, a network node that connects together at least two of the links with the network node protected by at least two of the circuit opening devices.

In another aspect, a return path connected is to each of the power source and the first and second electrical devices with the return path positioned away from the lattice circuit.

In another aspect, a pair of light paths that extend along each of the links with each of the light paths configured to transmit light in a single direction with a first one of the pair of light paths configured to transmit light in a first direction and a second one of the pair of light paths configured to transmit light in an opposing second direction.

The various aspects of the various embodiments may be used alone or in any combination, as is desired.

BRIEF DESCRIPTION OF THE DRAWINGS

FIG. 10 is a schematic diagram of a section of a protective mesh.

FIG. 25 is a schematic diagram of a frame.

DETAILED DESCRIPTION

Figure 1:
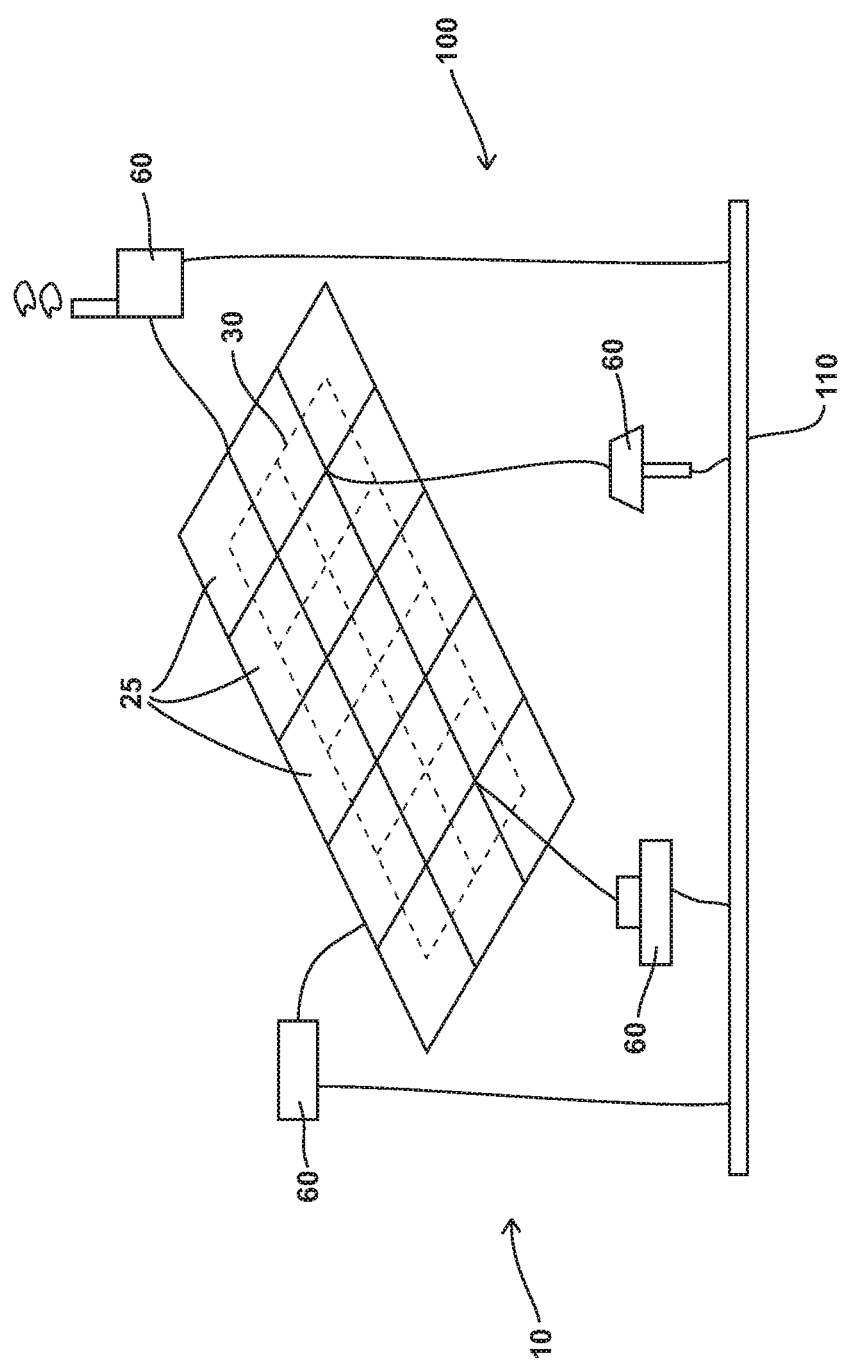
FIG. 1 is a schematic diagram of a protective mesh system incorporated into a living space.

FIG. 1 schematically illustrates a protective mesh array 10 that is arranged in a side-by-side configuration and form a wall, floor, ceiling, etc. The panels 25 include electrical circuitry that when electrically connected together form a protective mesh 30 that spans across the protective mesh array 10. The protective mesh 30 is of a single polarity and provides for supplying electrical power to power devices 60 such as various electrical components such as computers and lights within an adjacent room. In addition, other power devices 60 can supply power to the protective mesh array 10. These supplying power devices 60 can be local, such as solar panel, or can be remote, such as the electrical grid supplied by a public power company.

The panels 25 can provide a decorative feature of a living or office space. Examples include but are not limited to ceiling panels in a drop-down ceiling, wall tiles that mount together on a room wall, and floor tiles that form a walking surface on a floor. In addition, the panels 25 connect together to form the protective mesh array 10 to supply power to electrically-powered devices in the area. This provides for placing these devices at desired locations, instead of in proximity to electrical outlets which is currently required for room designs.

Figure 2:
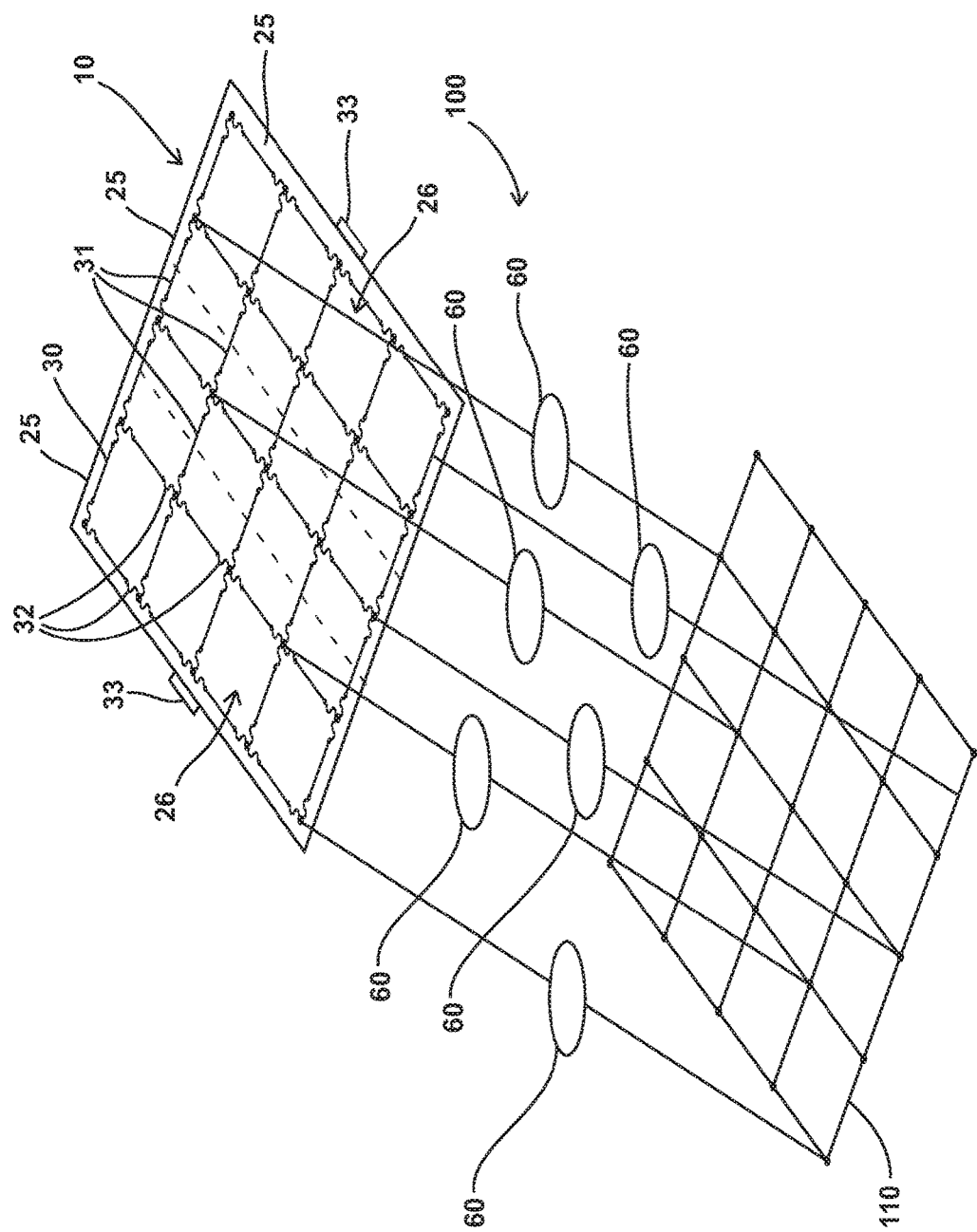
FIG. 2 is a schematic diagram of an electrical network that includes a protective mesh system and a return path, and with power devices connected to the electrical network.

FIG. 2 illustrates another schematic diagram of the protective mesh array 10 within an electrical network 100. The protective mesh array 10 includes the panels 25 that connect together to form the protective mesh 30. The power devices 60 are connected to the protective mesh 30. The protective mesh 30 is of a single polarity and thus the power devices 60 are also connected to a return path 110 to form the electrical network 100. Thus, the power devices 60 are connected to each of the protective mesh 30 and an unprotected mesh 110. In this example, the protective mesh 30 has a first polarity and the unprotected mesh 110 has a different second polarity. The electrical network 100 can include one or more switches to control the flow of electrical current.

The protective mesh 30 includes multiple electrical paths to each of the different power devices 60. In the event of a failure of one of the paths, the power devices 60 are still electrically connected through one or more alternative paths. The power devices 60 can include electrical sources, loads, and storage devices. Sources provide electricity to the network 100. Sources 60 can include but are not limited to electric generators, solar panels, and windmills. Loads are devices that consume electrical power such as appliances, lighting, electronics, etc. Storage devices such as batteries can either add or subtract electrical power. Storage devices act as loads when being charged through the electrical network 100, and act as sources when discharging to the electrical network 100.

The panels 25 have one or more functions. A first function is to form a physical section of the wall, floor, ceiling, etc. across which the protective mesh array 10 spans. A section function is to have an aesthetically pleasing appearance such that the panel 25 and the entire protective array mesh 10 blends into the environment such that persons are unaware of its electrical functionality. Similarly, the panel 25 physically hides the protective mesh 30 such that it is not visible within the area. A third function is to support and protect the protective mesh 30 which is positioned within or on a surface of the panel 25. A fourth fundamental concept is to include a section of the protective mesh 30 that provides for electrically distributing power within the area.

Figure 3:
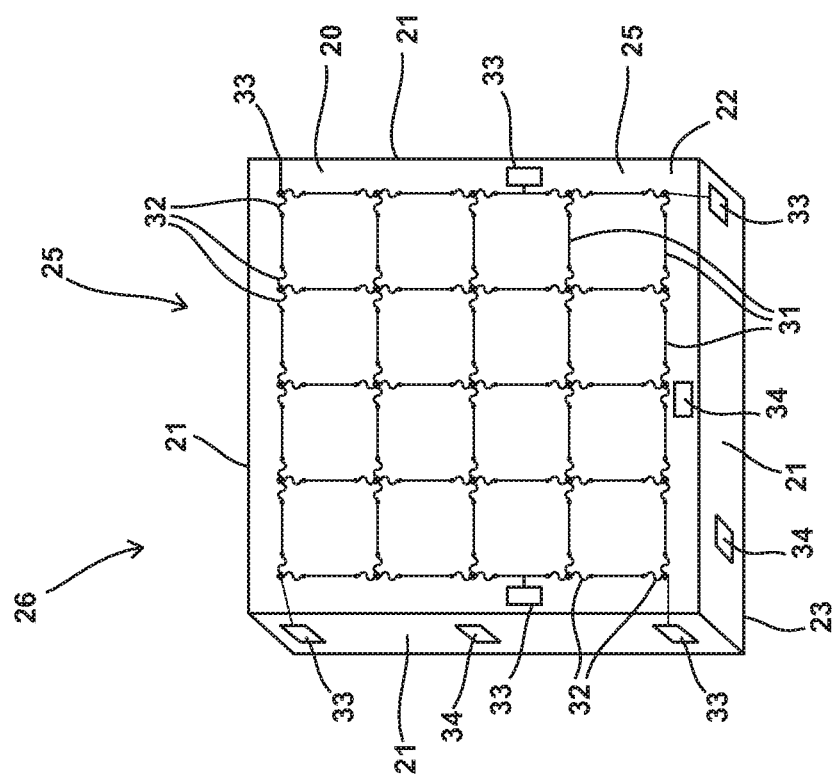
FIG. 3 is a schematic diagram of a panel.
Figure 4:
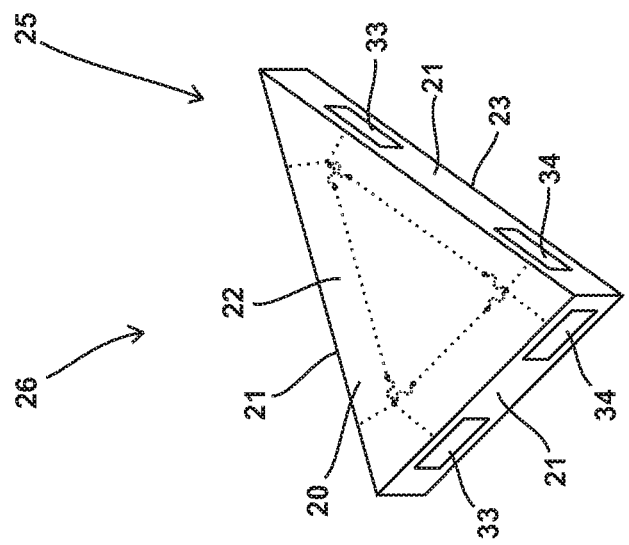
FIG. 4 is a schematic diagram of a panel.

The panels 25 can include various shapes and sizes. Within a single protective mesh array 10, the panels 25 can include the same or different shapes and/or sizes. FIG. 3 illustrates a panel 25 having a rectangular shape and FIG. 4 illustrates a triangular panel 25. The various panels 25 include a body 20 with opposing top and bottom sides 22, 23. The sides 22, 23 can each be planar to give the panel 25 a constant thickness. The top and/or bottom sides 22, 23 can also include different configurations such that the panel 25 has a varying thickness. In one example, the top and bottom sides 22, 23 are substantially flat. Outer edges 21 extend between the sides 22, 23 and can be straight, curved, or combinations of both. The protective mesh 30 is attached to and supported by the body 20. The protective mesh 30 can be positioned on the top side 22, the bottom side 23, or embedded within the body 20.

The panels 25 can be constructed from a variety of materials, including but not limited to plastic, metal, glass, ceramic, sheetrock, plywood, fiberglass, and combinations thereof. In one example, the panels 25 are rigid members with a fixed shape and size. In another example, the panels 25 are flexible and can be deformed to fit into a frame 90 of the protective mesh array 10.

The protective mesh 30 is formed by different mesh sections 26 that are positioned on the different panels 25. The different sections 26 are electrically connected together through one or more connectors 33 on the panels 25. The panels 25 can include the same or different mesh sections 26. In one example, the mesh section 26 is the same in each panel 25 of the protective mesh array 10. This facilitates interchanging and/or replacing a panel 25 from the larger protective mesh array 10. In another example, two or more panels 25 include different mesh sections 26.

The panels 25 include one or more electrical connectors 33 to connect to the other panels 25 and/or to a frame 90. The electrical connectors 33 can also provide for connecting to an external electrical system such as for the panels 25 located along the outer perimeter of the protective mesh array 10. In one example, the electrical connectors 33 provide a conduit through which electrical power enters into the protective mesh 30. The electrical connectors 33 can be positioned at various locations along the panels 25, including one or more of the outer edges 21, the top side 22, and the bottom side 23. Examples of electrical connectors 33 include but are not limited to plugs and lead wires.

One or more mechanical connectors 34 are positioned on the panels 25. The mechanical connectors 34 provide for connecting together adjacent panels 25 and/or the frame 90. The mechanical connectors 34 can be positioned at various locations on the panels 25, including one or more of the outer edges 21, the top side 22, and the bottom side 23. Examples of mechanical connectors 34 are disclosed in U.S. Pat. No. 10,371,575, and U.S. Patent Publication Nos. 2018/0195770, 2018/0195771, and 2019/0214941, each of which is hereby incorporated by reference in its entirety.

Figure 5:
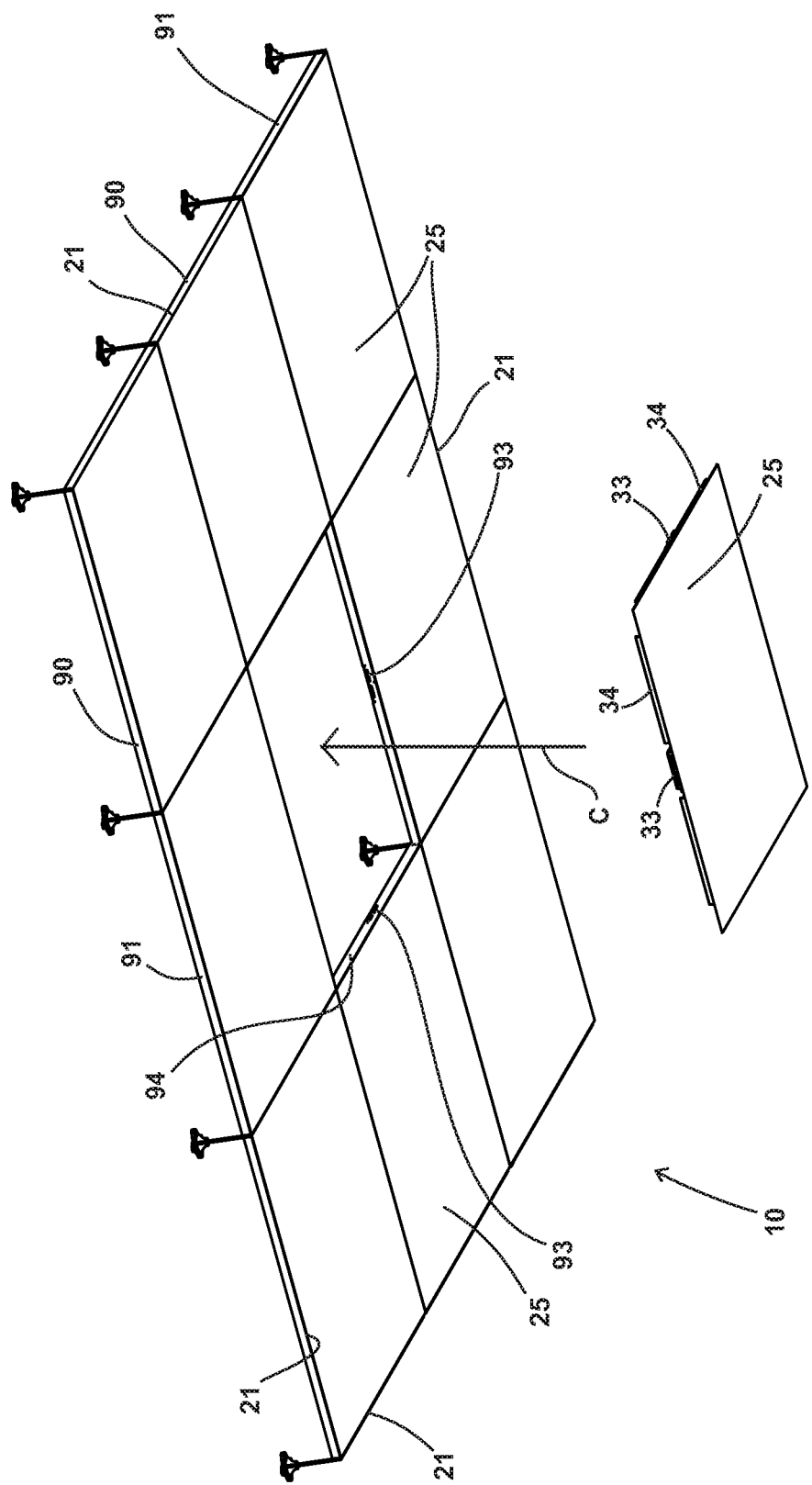
FIG. 5 is a perspective view of a panel being inserted into an opening in a protective mesh array.

FIG. 5 illustrates a protective mesh array 10 that forms a ceiling in a drop-ceiling configuration. The protective mesh array 10 includes multiple panels 25 that are mounted in a frame 90. The frame 90 includes structural member that provide for mechanically supporting each of the panels 25. The frame 90 further includes electrical connections to electrically connect to each of the panels 25. The shapes of the panels 25 and the frame 90 provide for the panels 25 to be orthogonally inserted and connected to the frame 90 as illustrated by arrow C in FIG. 5. In a similar arrangement, the panels 25 are angled and moved through the opening in the frame 90 and then vertically dropped into position.

Specifically in FIG. 5, a central panel 25 is being placed into the protective mesh array 10. The previous panel (not illustrated) has been disconnected and removed from the protective mesh array 10. The new panel 25 is orthogonally connected through the various connectors 33, 34, 93, 94.

Figure 6:
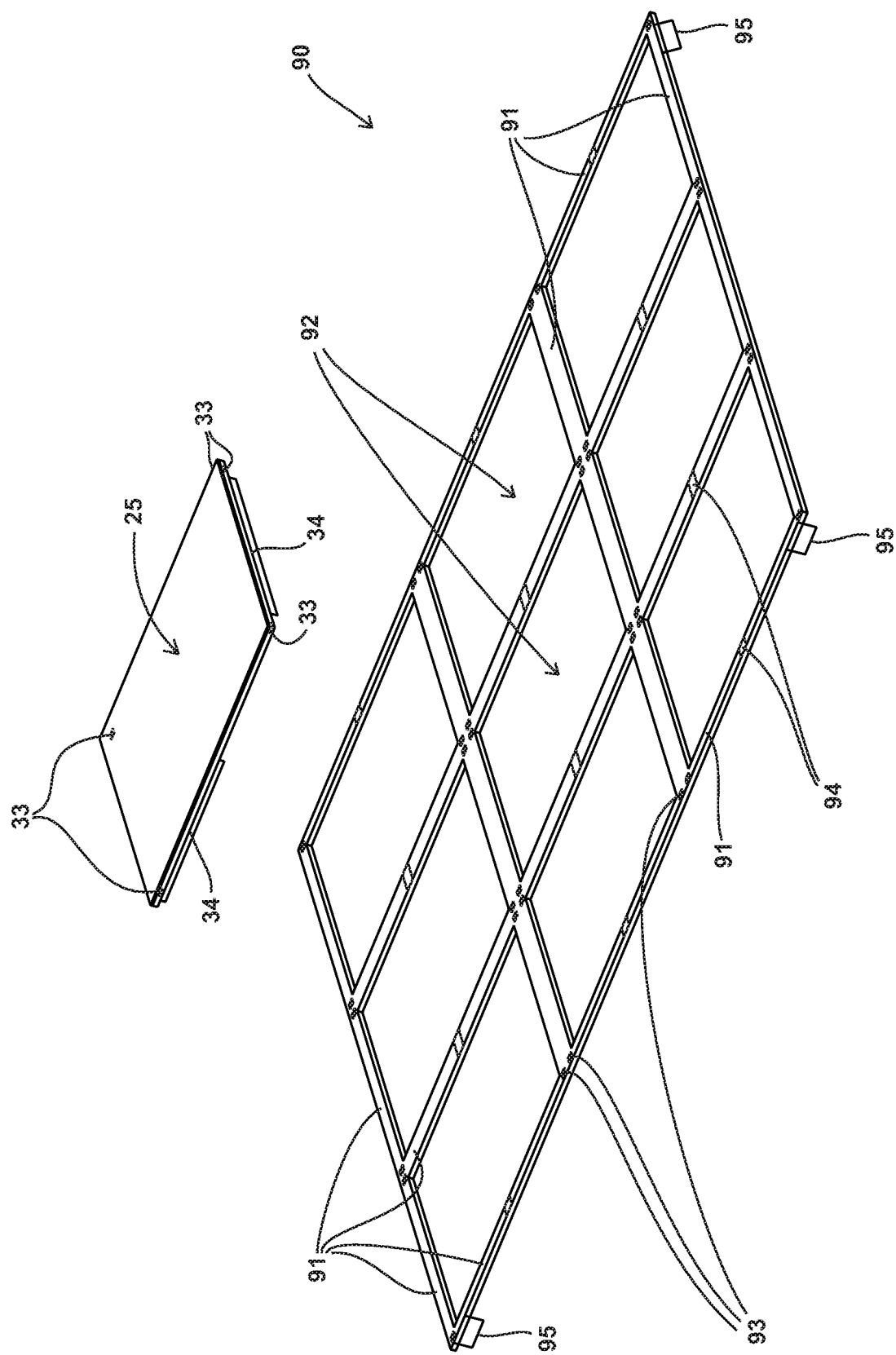
FIG. 6 illustrates a frame of a protective mesh array and a panel being inserted into an opening in the frame.

FIG. 6 illustrates a frame 90 that supports the panels 25. The frame 90 includes support members 91 that are spaced apart and form openings 92 into which the panels 25 are located. In one example, the frame 90 is visible to a user when the panels 25 are attached. In another example, the frame 90 is hidden by the panels 25. Mechanical connectors 94 are positioned on the frame 90 to engage with the corresponding mechanical connectors 34 on the panels 25 to mechanical connect the panels 25 to the frame 90. The mechanical connectors 94 can include various configurations, such as but not limited to clips, plugs, and ball-and-detent configurations. In one example, the panels 25 are inserted from above the frame 90 and physically contact against and are supported by support surfaces on the frame 90. Electrical connectors 93 are also positioned on the frame 90 to electrically connect to the panels 25. The electrical connectors 93 can include various configurations, including but not limited to plugs and wire contacts. Examples of electrical and mechanical connectors 93, 94 are disclosed in U.S. Pat. No. 10,371,575, and U.S. Patent Publication Nos. 2018/0195770, 2018/0195771, and 2019/0214941, each of which is hereby incorporated by reference in its entirety.

In one example as illustrated in FIG. 6, the electrical and mechanical connectors 93, 94 are uniformly positioned on the frame 90. This provides for the panels 25 to be connected in a consistent manner along the frame 90.

In one example as illustrated in FIG. 6, the electrical contacts 93 are positioned on the surface of the frame 90. The electrical contacts 93 are located at each vertex and are each electrically common. In one example, each electrical contact 93 is individually protected by an over-current protecting device. Connectors 95 on the frame 90 provide for an electrical connection with a larger electrical network 100.

Figure 7:
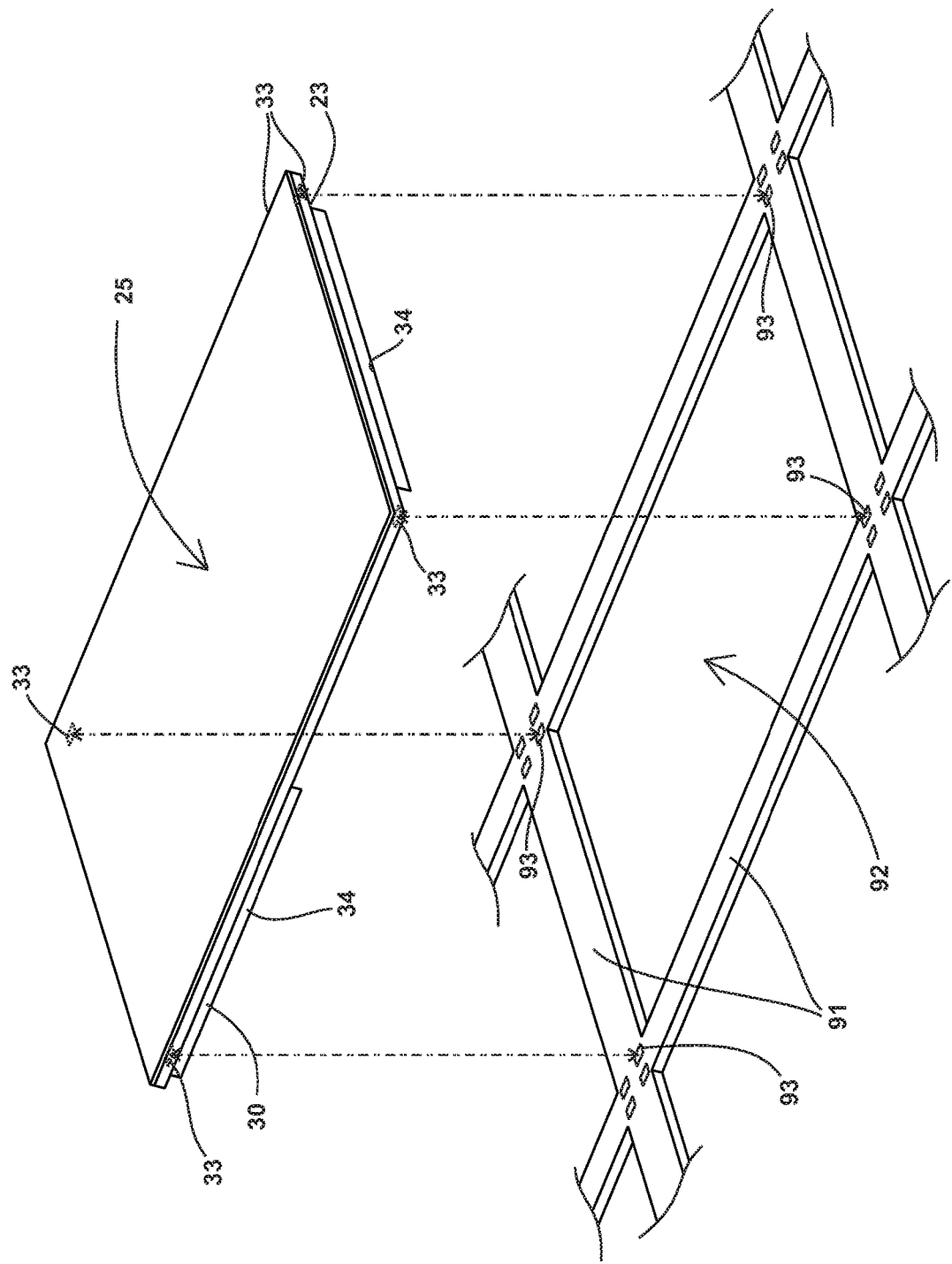
FIG. 7 is a schematic diagram of a panel being inserted into an opening of a frame of a protective mesh array.

FIG. 7 illustrates a panel 25 being inserted into an opening 92 in a frame. The panel 25 includes mechanical connectors 34 that engage with the supports 91 of the frame 90. In one example, the mechanical connectors 34 are biased outward and are deformed and snap into positioned against the inside edge of the supports 91 and/or the top edge of the supports 91. Electrical connectors 33 are positioned on the bottom side 23 of the panel 25. The electrical connectors 33 align and engage with corresponding electrical connectors 93 on the frame 90.

In another example, the panels 25 connect directly together without a frame 90. The mechanical connectors 34 can engage with each other and/or with the body 20 of the adjacent panels 25 to provide for mechanical attachment. The electrical connectors 33 engage together to provide for electrical connectivity.

When the panels 25 are connected together, the protective mesh 30 is formed by different sections 26 in the different panels 25. In one example, the section 26 is the same in each panel 25. In other examples, different sections 26 are included in different panels 25.

Figure 8:
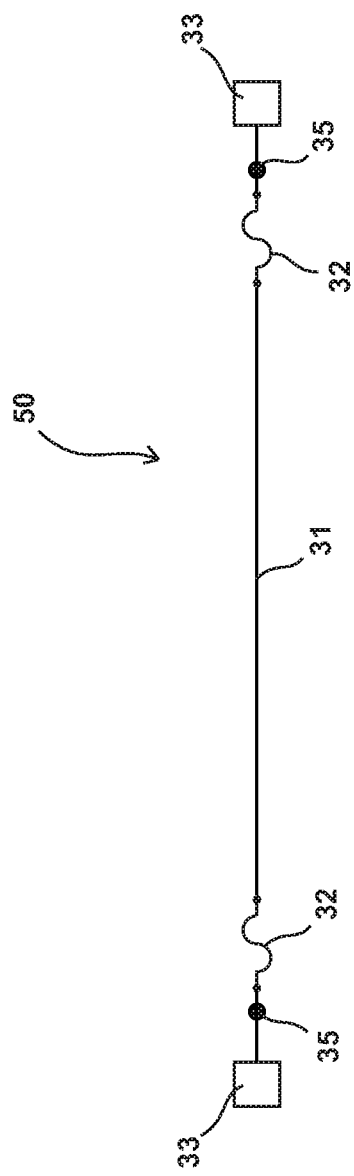
FIG. 8 is a schematic diagram of a link.

The sections 26 of the protective mesh 30 include one or more links 50 that are connected together at nodes 35. FIG. 8 illustrates one example of a link 50 in a mesh section 26. In the example of FIG. 8, the link 50 includes a conductive element 31 for conducting electricity, and a pair of circuit opening devices 32 on opposing ends. The link 50 is considered to be protective because the conductive element 31 is protected on opposing ends by a circuit opening device 32 for protection from excess current.

Figure 9:
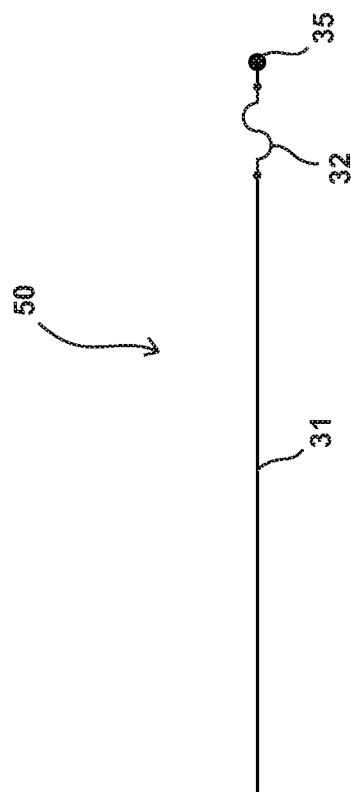
FIG. 9 is a schematic diagram of a link.

FIG. 9 illustrates a link 50 that includes a conductive element 31 and a single circuit opening device 32. This link 50 is not protective because there is just a single circuit opening device 32 on one side of the conductive element 31. Excess current could affect a power device 60 attached to the conductive element 31 through the non-protected end. This link 50 would be incorporated into the protective mesh 30 in a manner to prevent the excess current from possibly causing damage as will be explained below.

The protective mesh 30 provides for the links 50 to be electrically supplied from two or more different electrical paths. The electrical paths can reach the links 50 at different sections (e.g., FIG. 8 can include the different paths connecting to the end nodes 35). This provides for electrical power to reach the link 50 and to flow to the attached power device 60 through multiple paths. Under a first situation (i.e., normal operating condition), electrical current is provided to each of the one or more power devices 60 through one or more first paths formed by the links 50. In the event of a failure of one or more of the links 50, electrical current is provided to the one or more power devices 60 through one or more second paths that are formed by the remaining active links 50.

The conductive elements 31 provide for the flow of electrical current in one or more directions. The conductive elements 31 can be made from various materials and can include a variety of lengths.

The circuit opening devices 32 provide automatic protection from damage that could be caused by excess current. Examples of different circuit opening devices 32 include but are not limited to circuit breakers and fuses. In one example, each of the circuit opening devices 32 is the same throughout the protective mesh 30. In other examples, two or more different circuit opening devices 32 are used within the protective mesh 30. Nodes 35 are interfaces for connecting the links 50 together. Nodes 35 also provide for a connection point with one or more power devices 60.

The protective mesh 30 can include different configurations depending upon the configurations of the links 50. FIG. 2 includes the protective mesh 30 with a uniform arrangement formed by mesh sections 26 with links 50 which each have a straight shape and are connected together at their ends to form a pattern of rectangular sections. The links 50 can be connected together to form sections with various shapes, such as squares, rectangles, triangles, pentagons, etc. The protective mesh 30 can have sections with a uniform arrangement as illustrated in FIG. 2, or the sections can form irregular patterns in which no two sections are the same.

FIG. 10 illustrates a mesh section 26 that includes three links 50 connected at a network node 35*b*. A network node 35*b* is a node 35 that is protected by at least three circuit opening devices 32. In the example of FIG. 10, each link 50 includes a conductive element 31 that connects together at the network node 35*b*. Each link 50 also includes a circuit opening device 32 positioned along the conductive element 31 away from the network node 35*b*. Thus, node 35*b* is a network node because it is protected by at least three circuit opening devices (with the example of FIG. 10 specifically including the network node 35*b* being protected by three circuit opening devices 32). A power device (not illustrated in FIG. 10) that is connected to the network node 35*b* is thus protected from excess current.

Figure 11A:
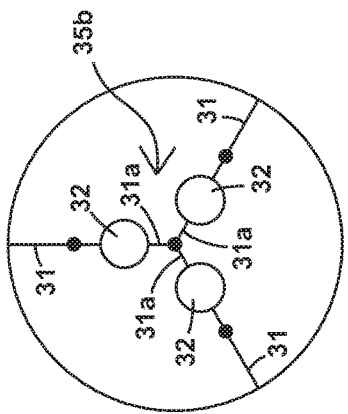
FIG. 11A is a close-up view of the network node of FIG. 11.
Figure 11:
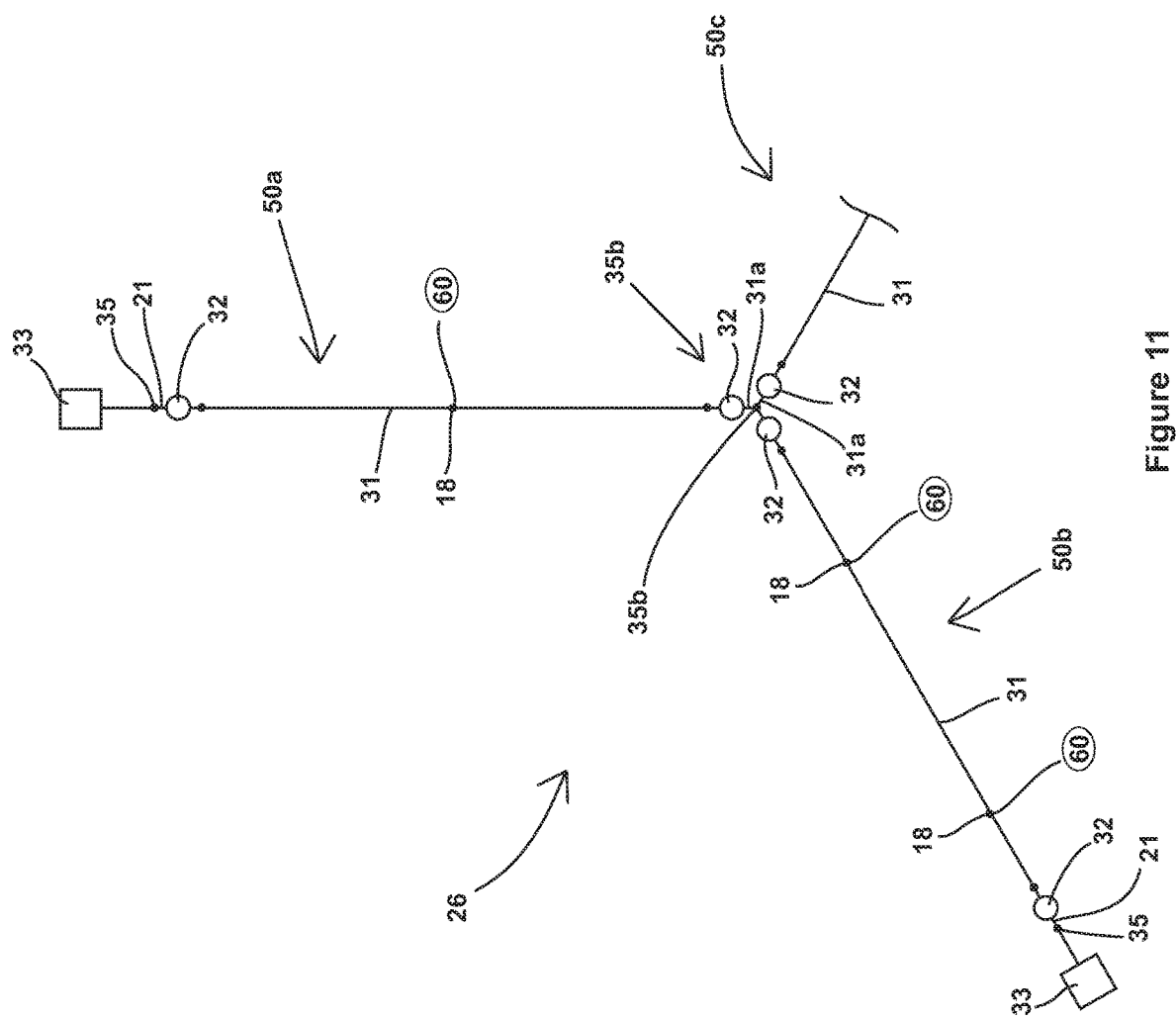
FIG. 11 is a schematic diagram of a section of a protective mesh.

FIG. 11 illustrates another mesh section 26 that includes a first link 50*a* with a first conductive element 31 having circuit opening devices 32 on opposing sides. A second link 50*b* includes a second conductive element 31 and at least one circuit opening device 32. A third link 50*c* includes a third conductive element 31 and at least one circuit opening device 32. As illustrated in FIG. 11A, the three links 50*a*, 50*b*, 50*c* each include a smaller conductive section 31*a* that connects at the network node 35*b* to form a star configuration.

Figure 12A:
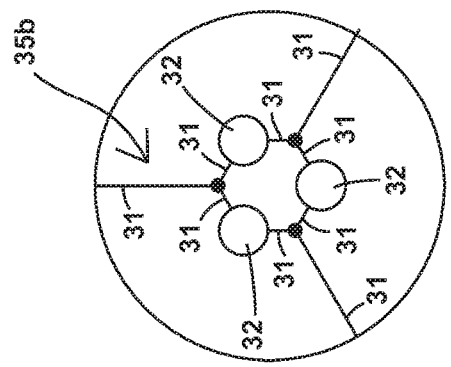
FIG. 12A is a close-up view of the network node of FIG. 12.
Figure 12:
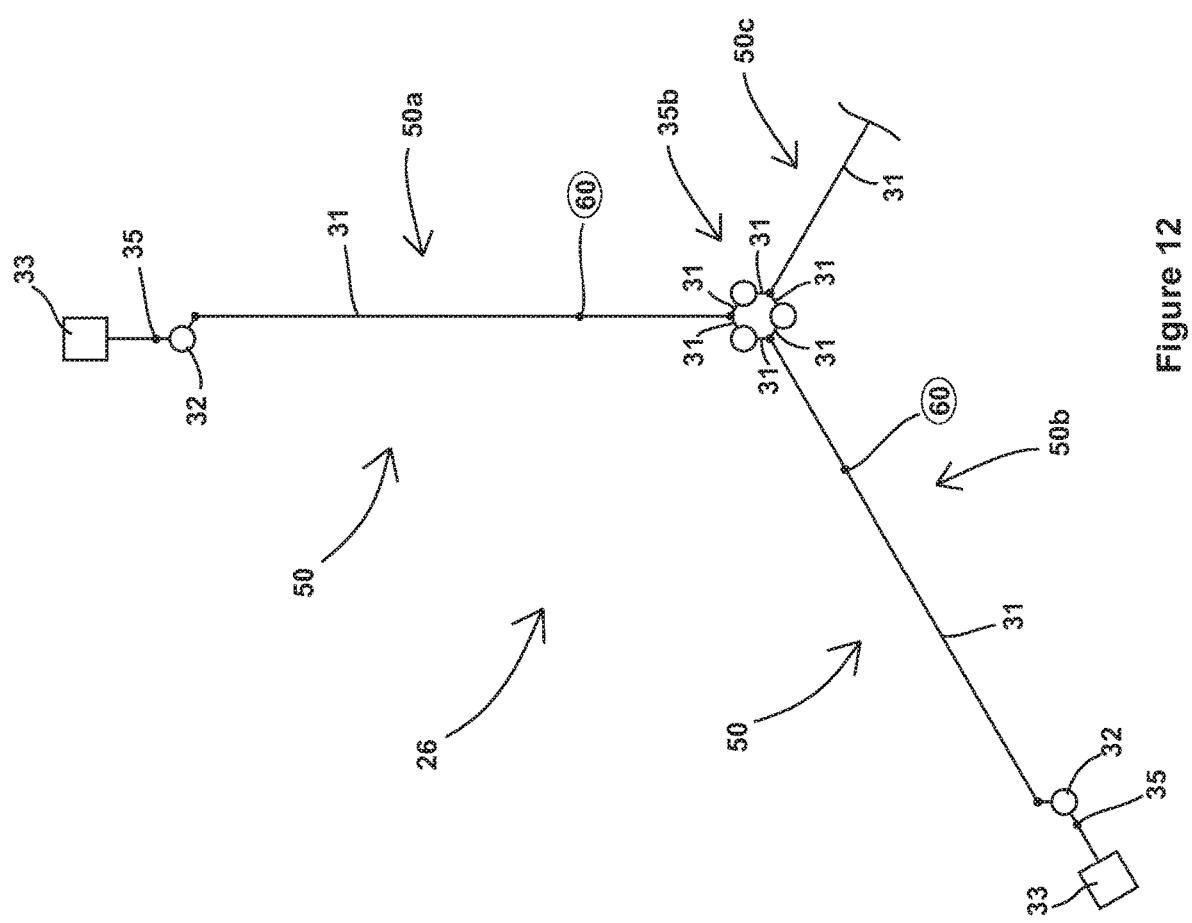
FIG. 12 is a schematic diagram of a section of a protective mesh.

FIG. 12 illustrates another section of a protective mesh 30. A first link 50*a* includes a first conductive element 31 with circuit opening devices 32 on opposing sides, a second link 50*b* with a second conductive element 31 and at least one circuit opening device 32, and a third link 50*c* with a conductive element 31. Links 50*a*, 50*b*, 50*c* are connected at a network node 35*b* that forms a ring configuration. Each link 50 includes a conductive element 31 with a main section that divides into a pair of outer conductive elements. Circuit opening devices 32 are connected to each of the outer conductive elements to form a ring configuration. In one example, current enters through an outer node 35 and passes through a main section of one link 50, through two of the associated outer conductive elements 31, and through the two associated circuit opening devices 32. FIG. 12A illustrates the network node 35*b* of FIG. 12.

Figure 14:
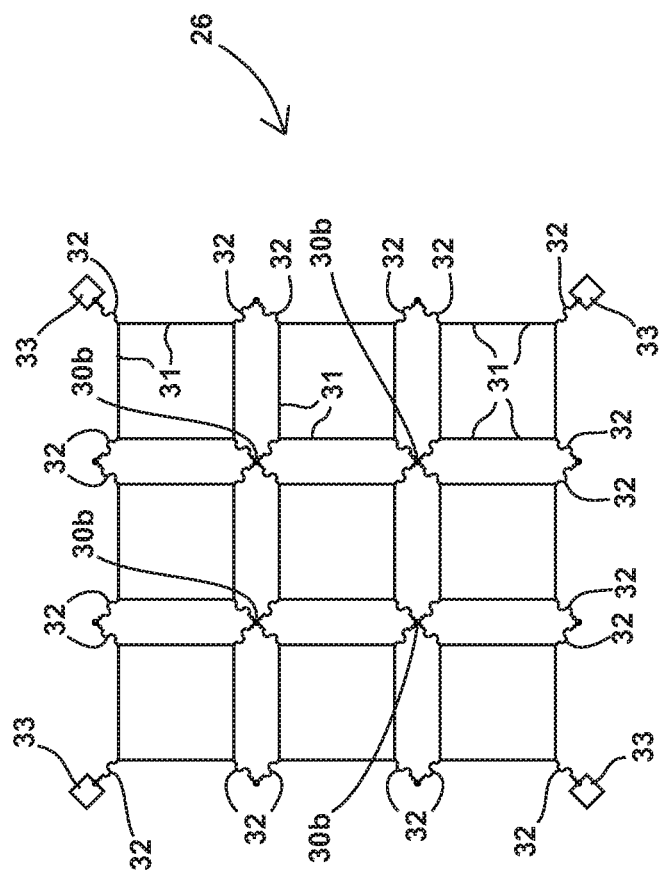
FIG. 14 is a schematic diagram of a protective mesh that includes the section of FIG. 13.
Figure 13:
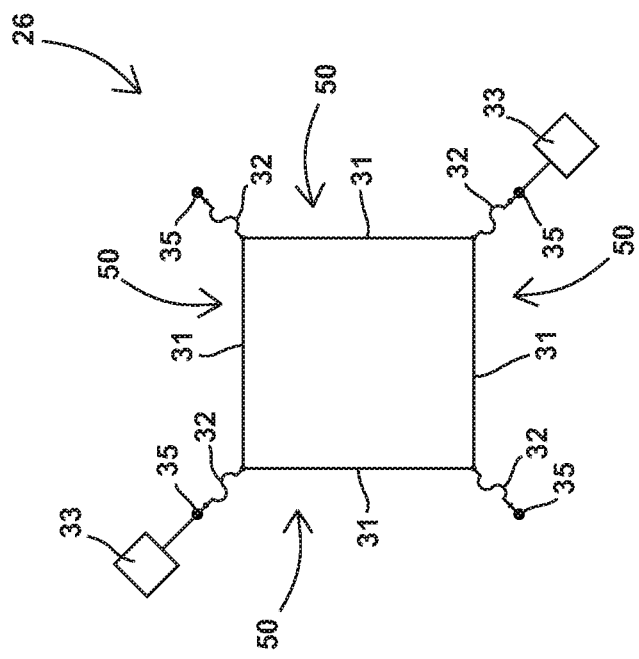
FIG. 13 is a schematic diagram of a protective mesh.

FIG. 13 illustrates the ring pattern with a set of conductive elements 31 electrically connected together and protected by circuit opening devices 32 at each input location. FIG. 14 illustrates a mesh section 26 having multiple ring patterns.

Figure 16:
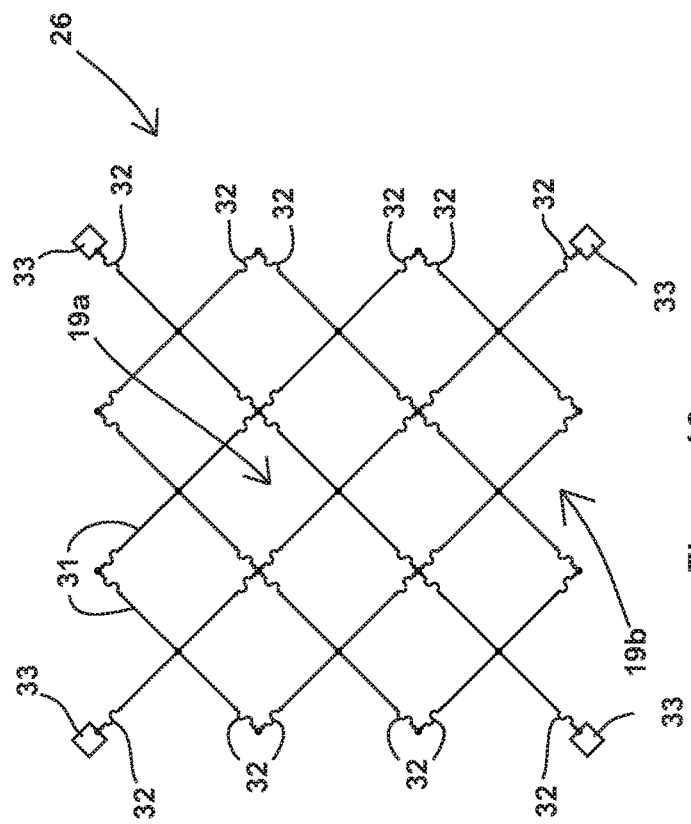
FIG. 16 is a schematic diagram of a protective mesh that includes the section of FIG. 15.
Figure 15:
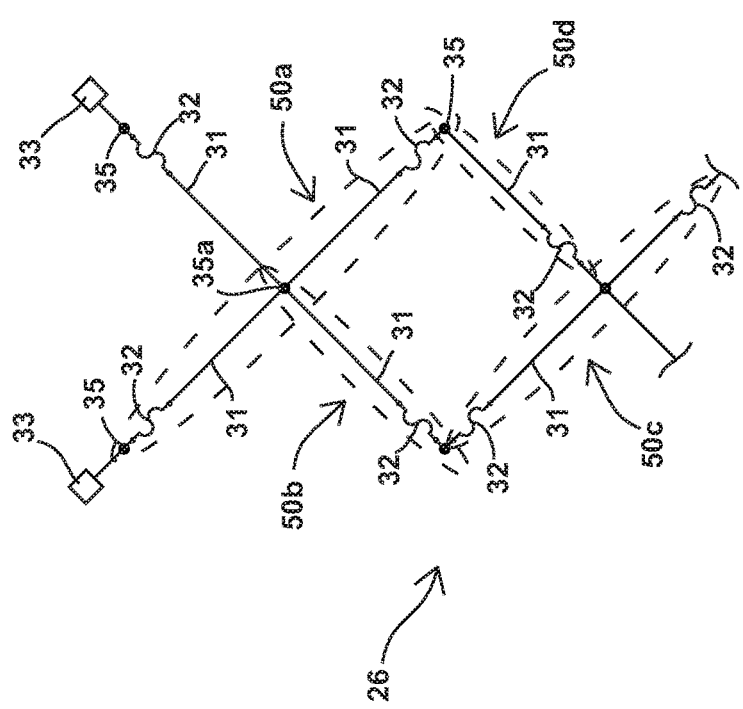
FIG. 15 is a schematic diagram of a protective mesh.

FIG. 15 illustrates a mesh section 26 arranged in a star pattern. A first link 50*a* includes a first conductive element 31 with circuit opening devices 32 on opposing sides. A second link 50*b* includes a second conductive element 31 with at least one circuit opening device 32. The first and second links 50*a*, 50*b* are electrically connected together at a node 35*a* that is between the circuit opening devices 32 of the first link 50*a* and at a terminal end of the second link 50*b*. In one example, the second link 50*b* connects to a central point of the first link 50*a*. A third link 50*c* includes a third conductive element 31 with circuit opening devices 32 on opposing sides. A fourth link 50*d* includes a conductive element 31 with at least one circuit opening device 32. FIG. 16 illustrates a mesh section 26 formed by a number of smaller sections of FIG. 15.

The protective mesh 30 can include various mesh sections 26 and links 50. The protective mesh 30 can be uniform throughout.

Figure 17:
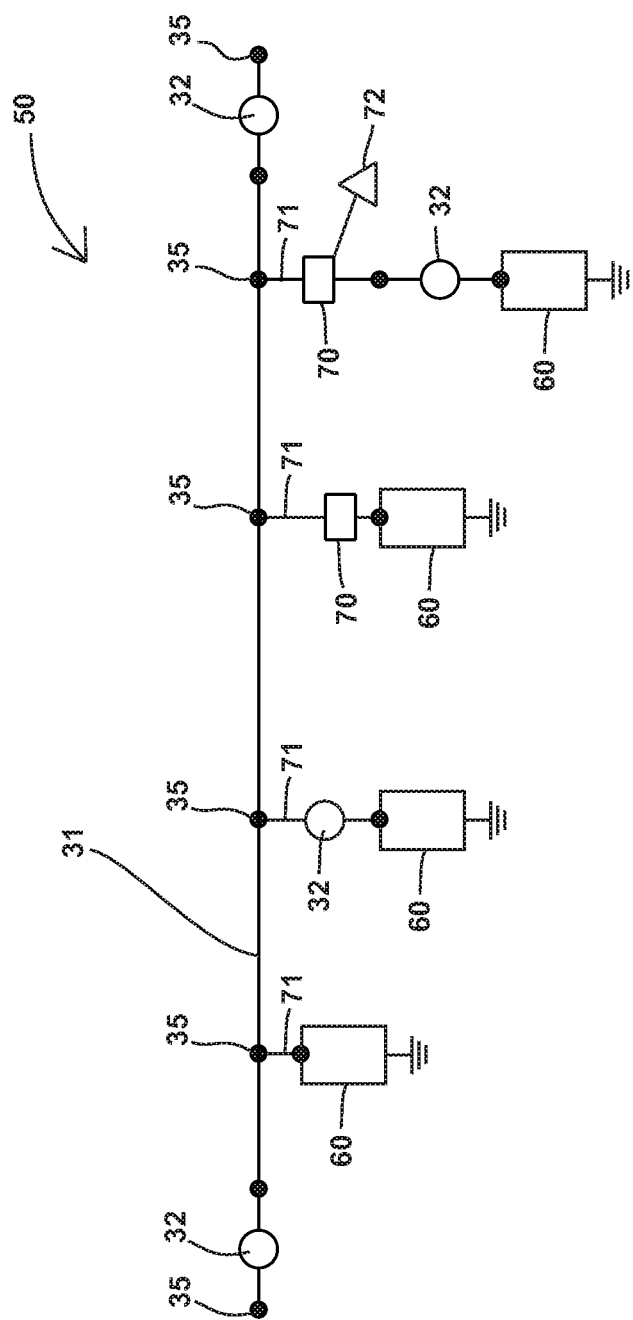
FIG. 17 is a schematic diagram of a link.

The power devices 60 connect to the links 50 at the nodes 35, and can also connect directly to the conductive elements 31. The nodes 35 can be configured to connect with one or more power devices 60. The nodes 35 can be connecting to one or more power devices 60, or can be used to connect with other links 50. In one example, the links 50 can be unused. FIG. 17 illustrates a link 50 with a conductive element 31 positioned between circuit opening devices 32. A variety of power devices 60 are connected to the conductive element 31 at nodes 35. Each of the power devices 60 is positioned on a spur line 71. Control devices 70 are positioned along one or more of the spur lines 71. The control devices 70 perform various functions to control the flow of current. Examples include but are not limited to a switch to turn on or off a power device 60, and a dimmer to dim a power device 60 (e.g., a light). In one example, a control device 70 is a mosfet and is controlled by a sensor. One or more sensors 72 are operatively connected to the control devices 70. The sensors 72 detect a condition that can provide for the control device 70 to reduce or shut down the current flow. In one example, a sensor 72 is a Reed switch.

Figure 18:
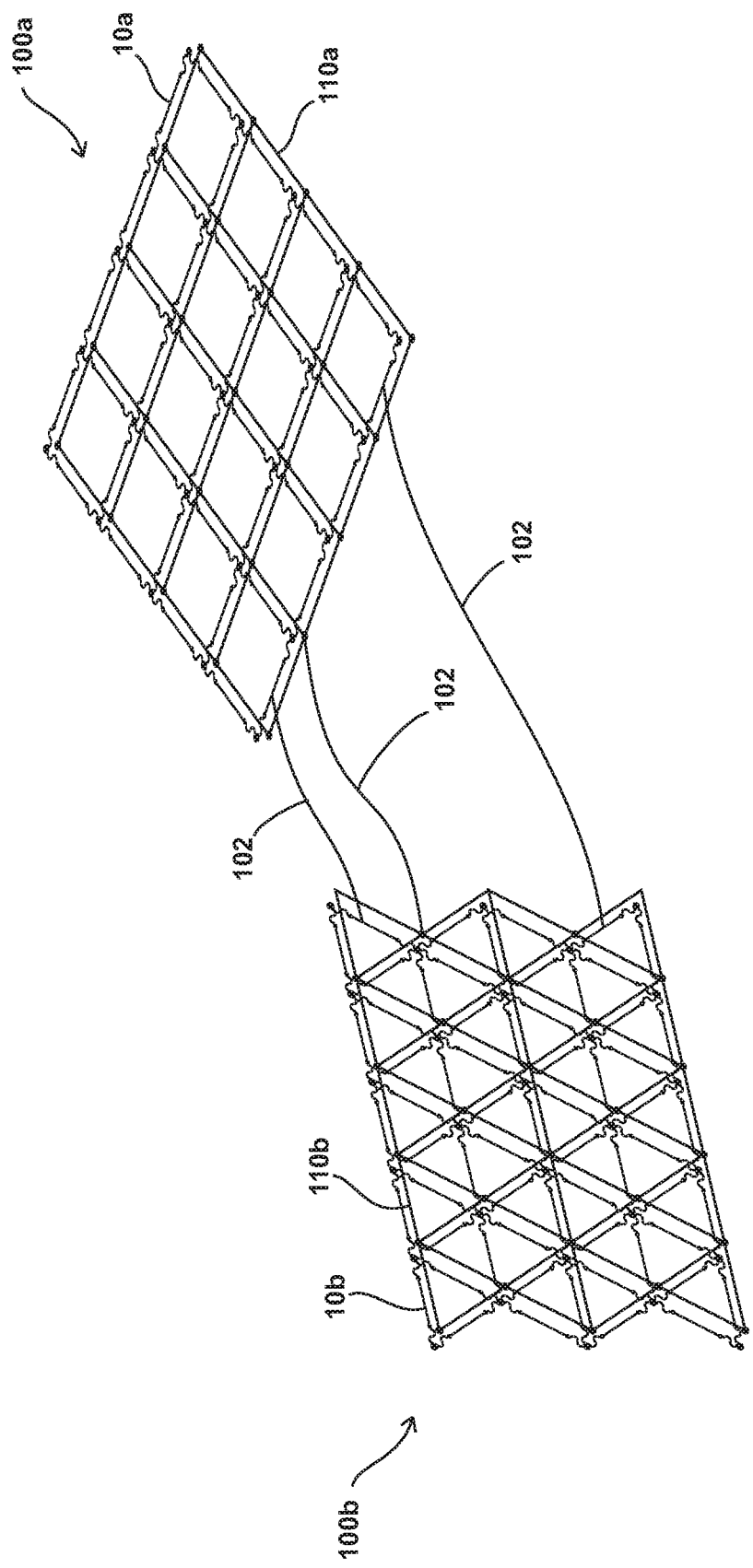
FIG. 18 is a schematic diagram of a pair of electrical networks that are electrically connected together.

Physically different electrical networks 100 are compatible and can be electrically connected together provided the voltage and phase is the same. As illustrated in FIG. 18, a first electrical network 100*a* includes a first protective mesh system 10*a* electrically connected to but isolated electrically from an unprotected mesh 110*a*. A second electrical network 100*b* includes a second protective mesh system 10*b* electrically connected to but isolated electrically from an unprotected mesh 110*b*. The electrical networks 100*a*, 100*b* are electrically connected together by one or more connectors 102. The connectors 102 are connected to each electrical network 100*a*, 100*b* at links 50 with the same voltage and polarity/phase. The connectors 102 can connect to one or more of a node 35 or along a conductive element 31.

Figure 19:
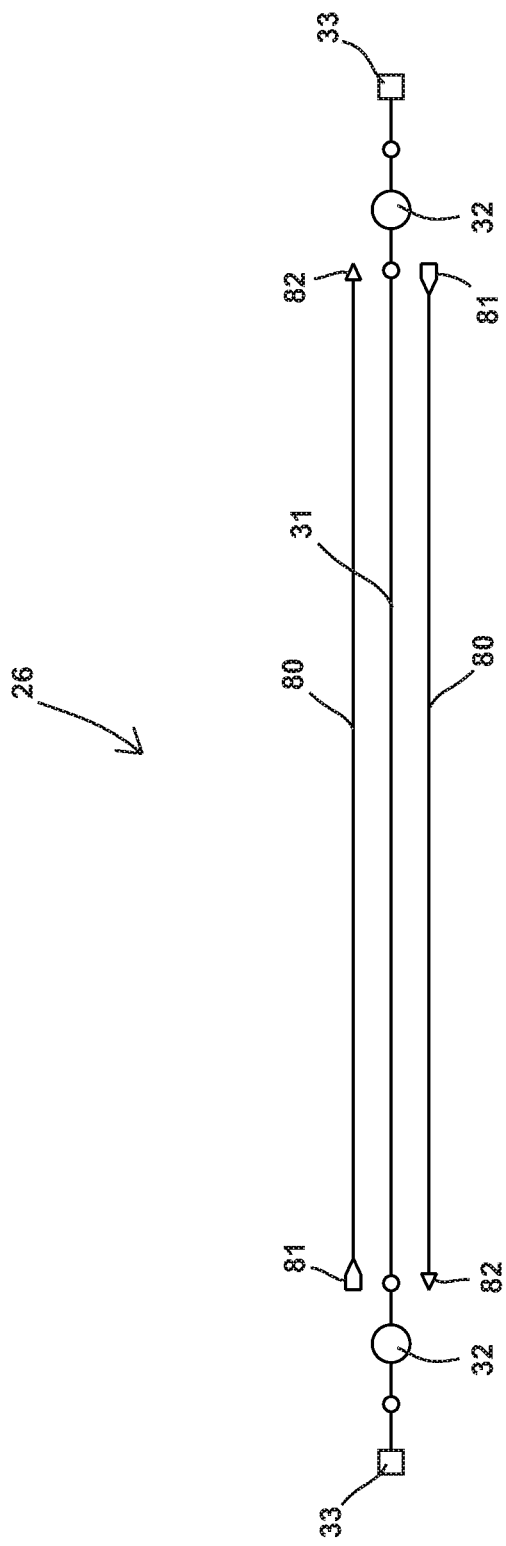
FIG. 19 is a schematic diagram of pair of light paths that extend along a link.

As illustrated in FIG. 19, a mesh section 26 can include one or more light paths 80. In on example, the light paths 80 are associated with the links 50. The light paths 80 of the different links 50 can be connected together and form a Li-Fi network. The network provides for optical communication that uses light propagating in free space to wirelessly transmit data. In one design, the network operates under standard IEEE 802.15.7 for visible light communication. Examples of a Li-Fi network with panels and arrays are disclosed in U.S. Pat. No. 10,263,700 which is hereby incorporated by reference in its entirety.

Each link 50 can include one or more light paths 80 for the transmission of signals in one or more directions. FIG. 19 illustrates a pair of light paths 80 each configured to receive and transmit signals in a single direction. Another example includes a light path 80 that is configured to transmit and receive signals in multiple directions for bi-directional communication. The light paths 80 can be connected to one or more additional light paths 80 to form the Li-Fi network.

Each light path 80 can also be equipped with one or more transmitters 81 and receivers 82. The transmitters 81 are configured to transmit light signals along one or more light paths 80. In one design, the transmitters 81 are light-emitting diodes (LED). The receivers 82 are configured to receive light signals along the Li-Fi network. The receiver 82 may be configured to receive light from one or more light paths 80. In one design, receivers 82 are photo diodes.

The light signals can be transmitted through various mediums. One example includes the light paths 80 including optical fiber configured to allow the passage of the light signals. The optical fiber can be made from glass or plastic. In another example, the light signals are transmitted through free space formed along the link 50.

Figure 20:
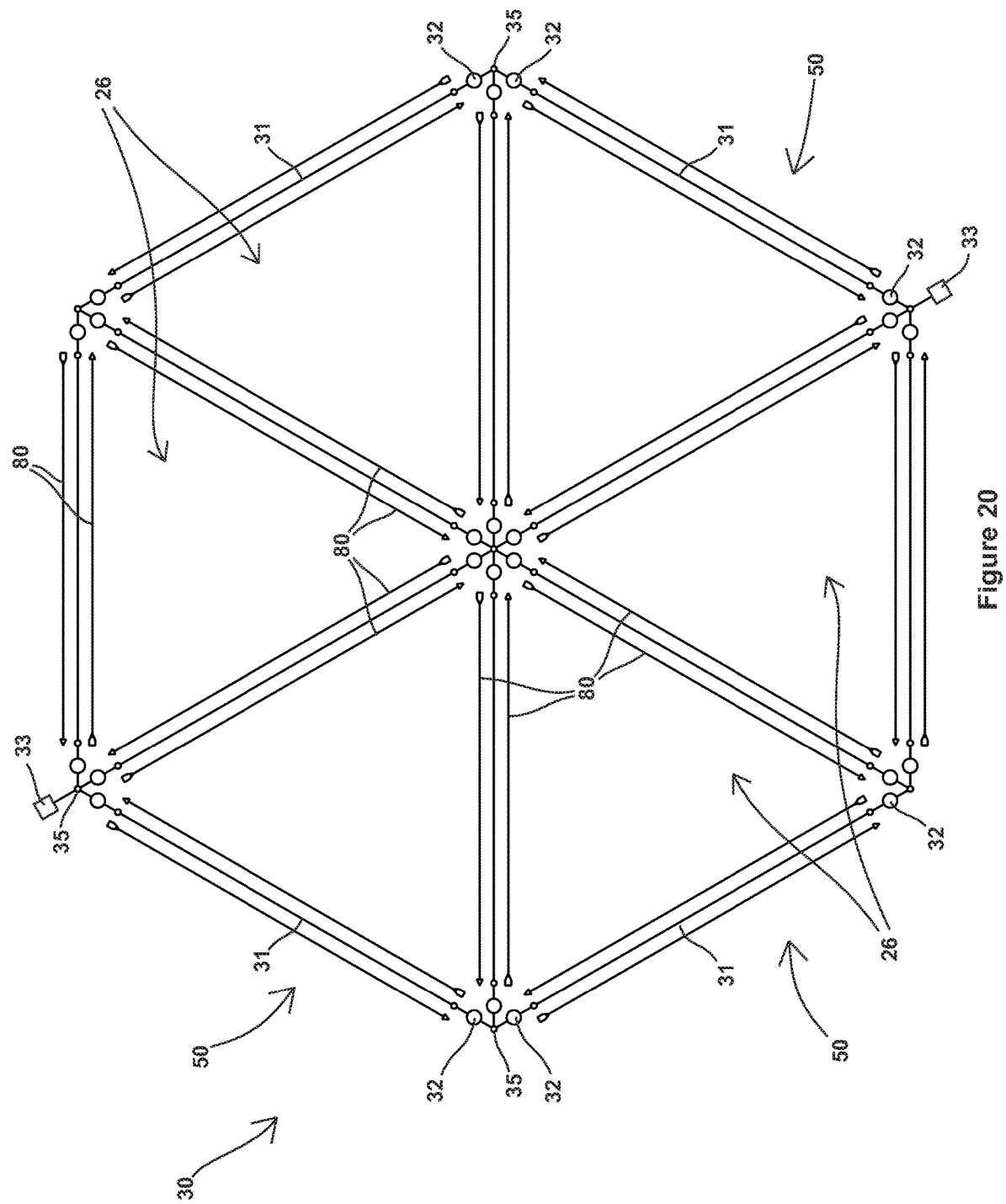
FIG. 20 is a schematic diagram of a protected conductive protective mesh that includes light paths.

FIG. 20 illustrates a protective mesh 30 formed by a plurality of mesh sections 26. Each mesh section 26 includes one or more links 50 with a conductive element 31 positioned between a pair of circuit opening devices 32. The links 50 are connected at nodes 35. Light paths 80 are associated with each of the links 50. Each light path 80 includes a transmitter 81 and receiver 82.

Figure 21:
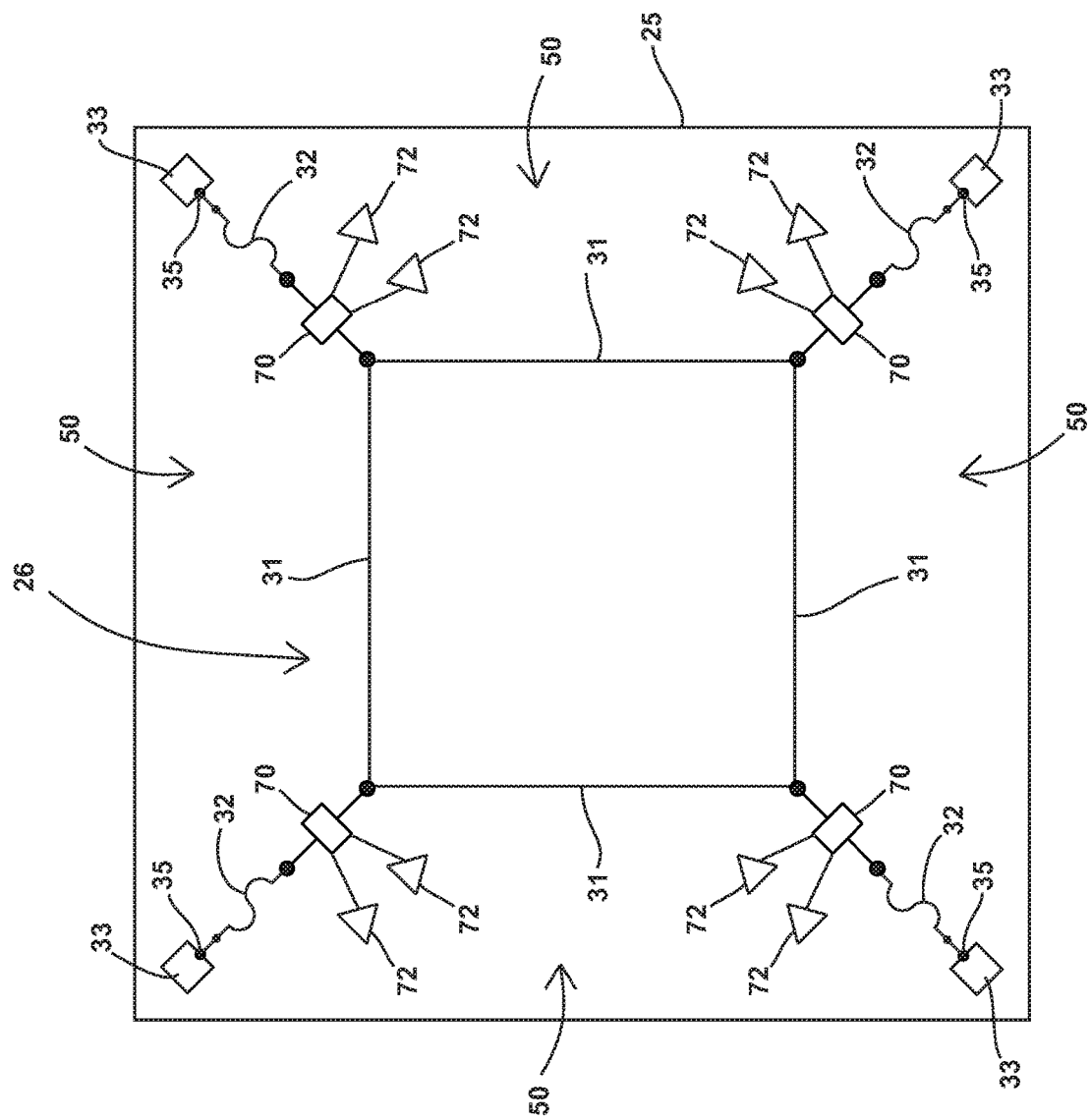
FIG. 21 is a schematic diagram of a panel of a protective mesh system that includes a protective mesh.

FIG. 21 illustrates a panel 25 that includes a mesh section 26 with electrical connectors 33 that provide a conduit for electrically connecting to other panels 25 and/or an external electrical network such as an electrical source. Control devices 70 and one or more sensors 72 are positioned in proximity to the electrical connectors 33. A series of conductive elements 31 are isolated within the system 10. This design isolates the panel 25 when being installed and removed, such as when the panel 25 is being installed into the protective mesh array 10. Since the panel 25 is electrically connected as part of the array 10 when in use (whether or not there is a power device 60 connected to the panel 25), power to the panel 25 can be disconnected as the panel 25 is removed or installed. This design can disconnect power by a control device 70 based on an input from one or more sensors 72.

Figure 22:
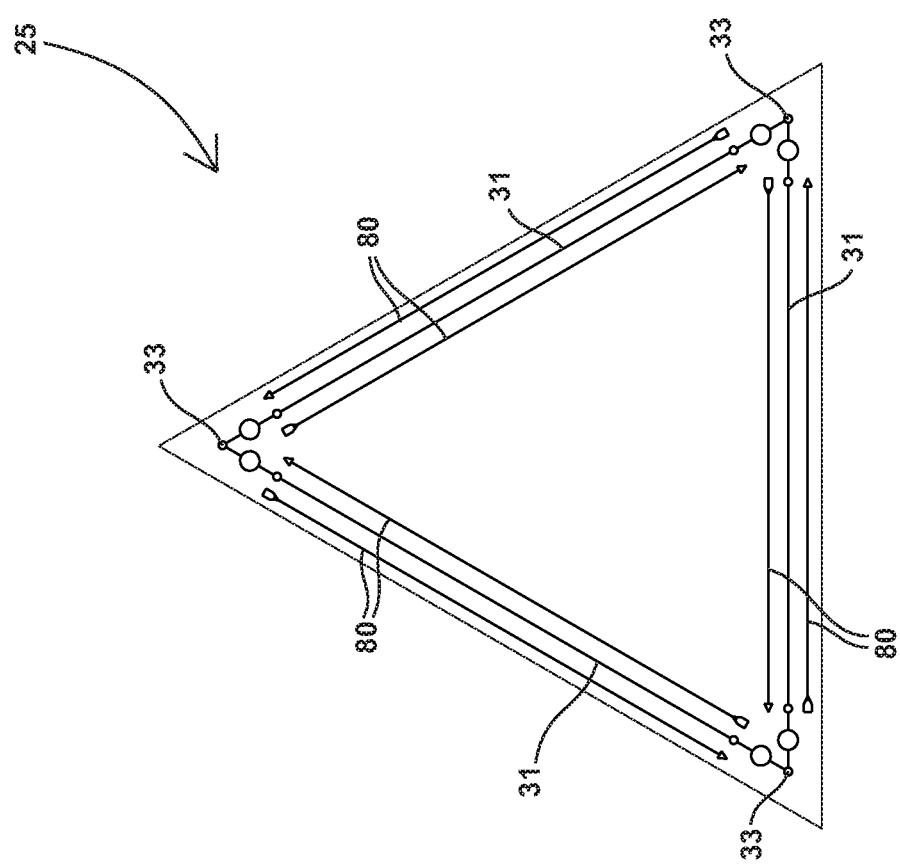
FIG. 22 is a schematic diagram of a panel.
Figure 23:
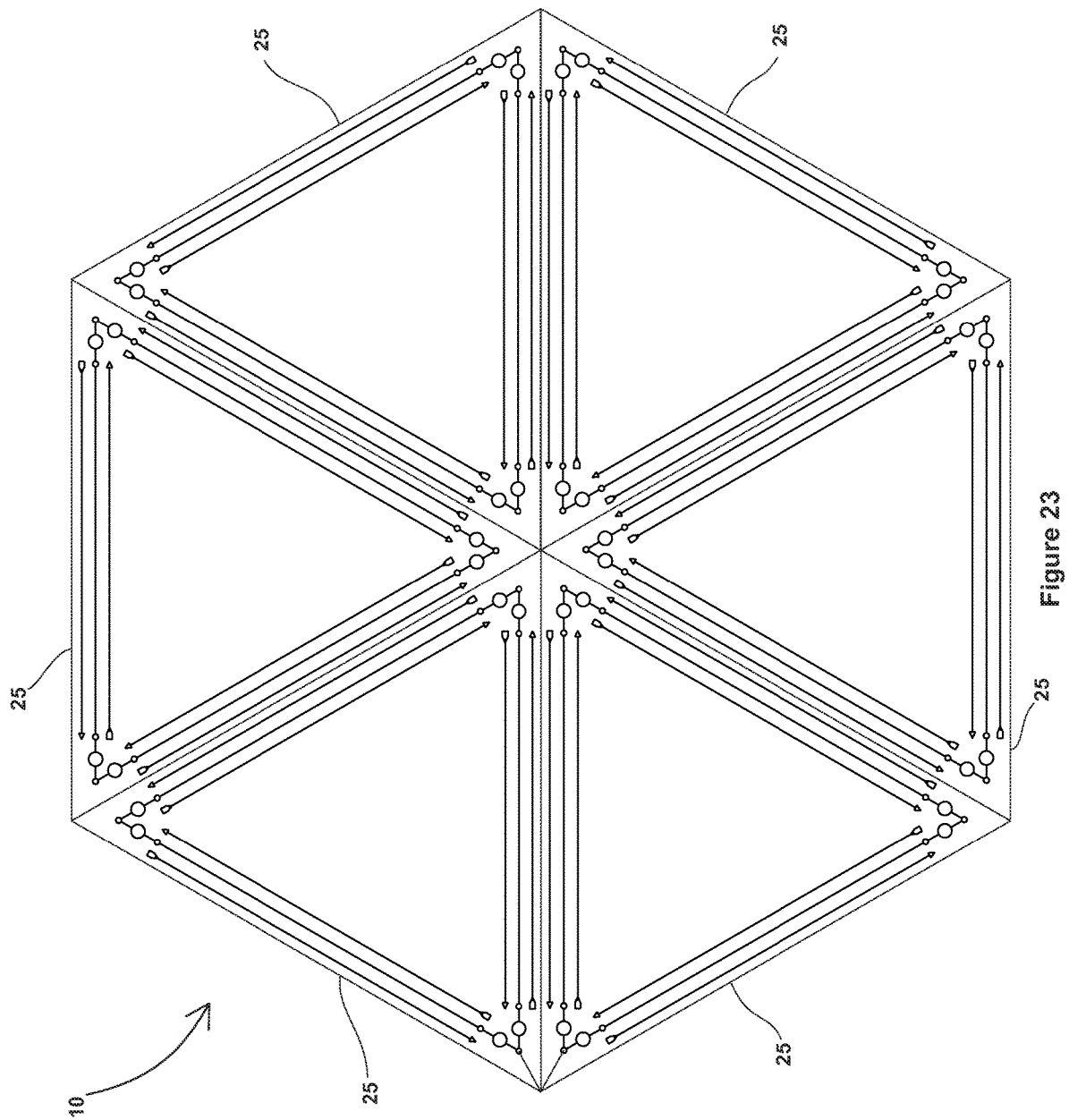
FIG. 23 is a schematic diagram of a protective mesh array comprising multiple panels.

FIG. 22 illustrates a panel 25 with electrical conductors 31 and light paths 80 extend along the perimeter sides. Connectors 33 are positioned along the perimeter to attach the panel 25 to a frame 90 and/or another panel 25. FIG. 23 illustrates a protective mesh array 10 formed by multiple panels 25 connected together in a side-by-side arrangement.

Figure 24:
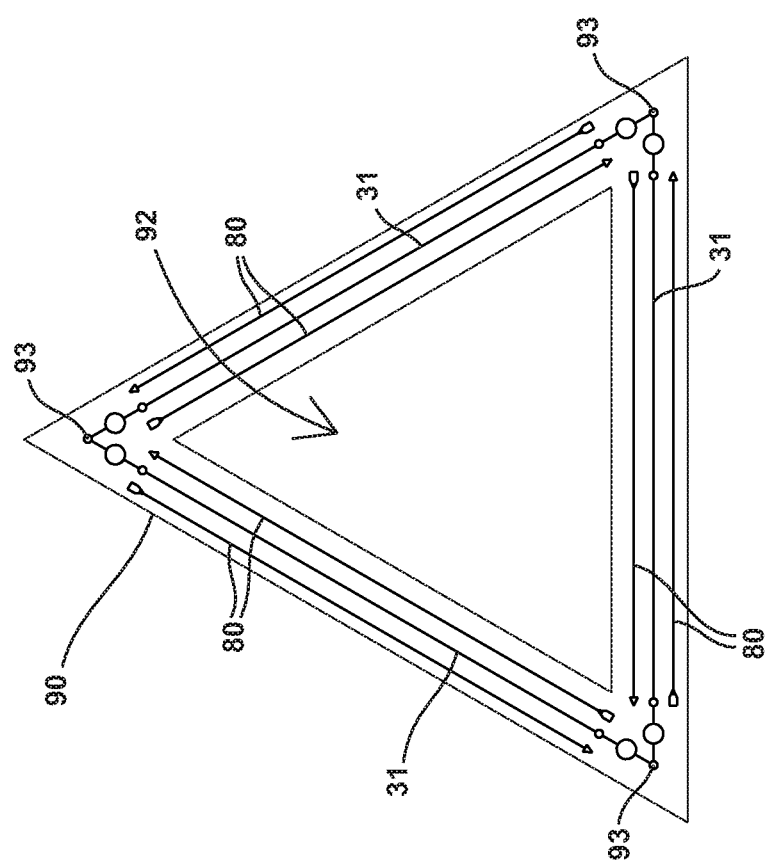
FIG. 24 is a schematic diagram of a frame.

FIG. 24 illustrates a frame equipped with multiple electrical conductors 31 and light paths 80. Connectors 93 are positioned to connect to panels 25 that are supported and connected to the frame 90. An opening 92 within the interior of the frame 90 is configured to physically and electrically support a panel 25. FIG. 25 illustrates another frame 90 that includes multiple openings 92 to support multiple panels 25.

In one example, one or more of the panels 25 include photovoltaic cells that absorb and convert sunlight into electricity. The cells form a power device 60 and deliver energy into the protective mesh 30.

In one example, the protective mesh array 10 is formed by a single panel 25.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive.

What is claimed is:

1. A protective mesh array for supplying electrical power to one or more power devices, the protective mesh array comprising: a plurality of panels each comprising: a top side, a bottom side, and outer edges; a mesh section attached to and supported by the panel, the mesh section comprising three or more electrical paths each comprising conductive elements; one or more circuit opening devices on each of the electrical paths, the electrical protective devices being current activated to electrically isolate the mesh section to prevent an excess current from reaching the conductive elements; and the plurality of panels configured to be positioned together and the mesh sections electrically connected together to form a single protective mesh that extends across the plurality of panels; and wherein the mesh section comprises: three or more electrical connectors to connect to two or more of the panels or to an external electrical system; a plurality of links electrically interconnected and electrically connected to the two or more electrical connectors, each of the links comprising at least one of the conductive elements and at least one of the circuit opening devices; and a plurality of nodes that connect together three or more of the links, each of the nodes positioned with at least one of the circuit opening devices electrically positioned between the node and each of the electrical connectors.

2. The protective mesh array of claim 1, further comprising a frame with a plurality of support members that are spaced apart to form openings each sized to receive one of the panels.

3. The protective mesh array of claim 2, further comprising one or more mechanical connectors on each of the panels to mechanically connect the panels to the frame with the top surfaces of the panels aligned together.

4. The protective mesh array of claim 1, wherein each of the links comprises a common number and arrangement of the conductive elements and the circuit opening devices.

5. The protective mesh array of claim 1, wherein the electrical connectors are positioned on the outer edges of the panels.

6. The protective mesh array of claim 1, further comprising a spur line that extends from the conductive element of one of the links, the spur line configured to be electrically connected to one of the power devices.

7. The protective mesh array of claim 1, further comprising one or more mechanical connectors on each of the panels to mechanically connect the panels together in the side-by-side arrangement with the top surfaces of the panels aligned together.

8. The protective mesh array of claim 1, wherein the mesh section is embedded within an interior of the panel in one or more of the panels.

9. The protective mesh array of claim 1, wherein one or more of the plurality of panels comprise photovoltaic cells that deliver energy into the mesh section.

10. The protective mesh array of claim 1, wherein the mesh section further comprising one or more light paths that extend along the conductive elements with the one or more light paths configured to be connected together to form a Li-Fi network.

11. The protective mesh array of claim 1, wherein the plurality of panels are ceiling panels that form a ceiling when positioned together.

12. The protective mesh array of claim 1, wherein the plurality of panels are floor panels that form a floor when positioned together.

13. A protective mesh array for supplying electrical power to one or more power devices, the protective mesh array comprising: a frame with frame electrical connectors; a plurality of panels that each include outer edges, three or more panel mechanical connectors to mechanically connect to the frame, and three or more panel electrical connectors to electrically connect to three or more of the frame electrical connectors; and a protective mesh that spans across the plurality of panels and is formed by individual mesh sections in the panels that are electrically joined through the electrical connectors, the protective mesh comprising conductive elements and one or more circuit opening devices at each of the electrical connectors that are current-activated to electrically isolate the mesh section within the panel; and wherein the conductive elements and circuit opening devices are connected together at a plurality of nodes, each of the nodes formed at an intersection of a plurality of links with each of the links comprising at least one circuit opening device and at least one of the electrical connectors with the at least one of the circuit opening device electrically positioned between the node and the electrical connectors to protect the power devices that are connected to the nodes from electrical current above a predetermined level.

14. The protective mesh array of claim 13, wherein the electrical connectors are positioned at the outer edges of the panels.

15. The protective mesh array of claim 13, wherein the protective mesh further comprises a spur line that extends from one of the conductive elements with the spur line electrically connected to one of the power devices.

16. The protective mesh array of claim 13, wherein one or more of the panels comprise photovoltaic cells that are electrically connected to the mesh section of the panel.

17. The protective mesh array of claim 13, wherein the conductive elements and circuit opening devices form the plurality of electrically interconnected links within the protective mesh, each of the links comprises one of the conductive elements and at least one of the circuit opening devices.

18. The protective mesh array of claim 17, wherein each of the links comprises a common number and arrangement of the conductive elements and the circuit opening devices with the protective mesh comprising a uniform arrangement.

19. The protective mesh array of claim 13, wherein the protective mesh further comprises a plurality of light paths configured to transmit signals and form a Li-Fi network that extends across the plurality of panels.

20. The protective mesh array of claim 13, wherein the plurality of panels are interior structural panels configured to form one of a wall, floor, and ceiling when positioned together.

21. A protective mesh array for supplying electrical power to one or more power devices, the protective mesh array comprising: a planar member comprising outer edges; a protective mesh attached to and supported by the planar member, the protective mesh configured to be electrically connected to the one or more power devices and comprising a plurality of links each comprising at least one conductive element and at least one circuit opening device, and with the links connected together at a plurality of nodes; each of the nodes configured to connect to one of the power devices; and the nodes positioned within the protective mesh with at least one of the circuit opening devices electrically positioned to protect the power devices and one or more of the conductive elements that are connected to the nodes from electrical current above a predetermined level; and two or more electrical connectors positioned on the outer edges of the planar member through which power is supplied to the protective mesh.

22. The protective mesh array of claim 21, wherein the planar member is divided into a plurality of panels that are electrically and mechanically connected together in a side-by-side arrangement with each of the panels comprising a mesh section with the protective mesh formed by the mesh sections of the plurality of panels.

23. The protective mesh array of claim 22, wherein one or more of the panels comprise the mesh section embedded within the panel.

24. The protective mesh array of claim 22, wherein the plurality of panels are floor panels that form a floor when positioned together.

25. The protective mesh array of claim 22, wherein the plurality of panels are ceiling panels that form a ceiling when positioned together.

26. The protective mesh array of claim 21, wherein the nodes are positioned inward away from the outer edges of the planar member.

27. The protective mesh array of claim 21, wherein one or more of the plurality of panels comprise photovoltaic cells that deliver energy into the mesh section.

28. The protective mesh array of claim 21, wherein the protective mesh further comprises a plurality of light paths comprising optical fibers configured to transmit signals and form a Li-Fi network that extends across the plurality of panels.

* * * * *